United States Patent
Hamada et al.

(10) Patent No.: US 7,385,021 B2
(45) Date of Patent: Jun. 10, 2008

(54) SACRIFICIAL FILM-FORMING COMPOSITION, PATTERNING PROCESS, SACRIFICIAL FILM AND REMOVAL METHOD

(75) Inventors: Yoshitaka Hamada, Joetsu (JP); Tsutomu Ogihara, Joetsu (JP); Motoaki Iwabuchi, Joetsu (JP); Takeshi Asano, Joetsu (JP); Takafumi Ueda, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 310 days.

(21) Appl. No.: 11/148,161

(22) Filed: Jun. 9, 2005

(65) Prior Publication Data

US 2005/0277755 A1    Dec. 15, 2005

(30) Foreign Application Priority Data

Jun. 10, 2004   (JP) .............................. 2004-172293

(51) Int. Cl.
*C08G 77/08* (2006.01)

(52) U.S. Cl. ............................ 528/12; 528/41; 528/39; 528/32

(58) Field of Classification Search ................ 528/12, 528/41, 39, 32
See application file for complete search history.

(56) References Cited

U.S. PATENT DOCUMENTS

| | | | |
|---|---|---|---|
| 6,268,457 B1 | 7/2001 | Kennedy et al. | |
| 6,506,497 B1 | 1/2003 | Kennedy et al. | |
| 7,202,013 B2 * | 4/2007 | Ogihara et al. | 430/270.1 |
| 2001/0050741 A1 * | 12/2001 | Hokazono et al. | 349/137 |
| 2004/0033700 A1 * | 2/2004 | Gronbeck et al. | 438/781 |

FOREIGN PATENT DOCUMENTS

| | | |
|---|---|---|
| JP | 11-322992 A | 11/1999 |
| JP | 2003-502449 A | 1/2003 |
| JP | 2004-051468 A | 2/2004 |
| WO | WO-00/77575 A1 | 12/2000 |

\* cited by examiner

*Primary Examiner*—Kuo-Liang Peng
(74) *Attorney, Agent, or Firm*—Birch, Stewart, Kolasch & Birch, LLP

(57) ABSTRACT

A sacrificial film-forming composition is provided comprising (A) an organofunctional silicone resin which is a co-hydrolytic condensate of hydrolyzable silanes having formula (1) and formula (2) and/or (3):

$$X—Y—SiZ_3 \quad (1)$$

$$R_nSiZ_{4-n} \quad (2)$$

$$P—SiZ_3 \quad (3)$$

wherein Z is a hydrolyzable group, X is a crosslinkable organofunctional group, Y is a single bond or a divalent hydrocarbon group, R is hydrogen or a monovalent hydrocarbon group, n is an integer of 0-3, and P is a substituent group which readily decomposes and volatilizes upon thermal decomposition, (B) a crosslinking agent, (C) an acid generator, (D) an extender or porogen, and (E) an organic solvent. The composition has improved storage stability, filling properties, adhesion and coating uniformity sufficient to form a sacrificial film which is effectively dissolvable in a stripping solution.

15 Claims, 4 Drawing Sheets

SACRIFICIAL FILM-FORMING COMPOSITION, PATTERNING PROCESS, SACRIFICIAL FILM AND REMOVAL METHOD

CROSS-REFERENCE TO RELATED APPLICATION

This Nonprovisional application claims priority under 35 U.S.C. §119(a) on Patent Application No. 2004-172293 filed in Japan on Jun. 10, 2004, the entire contents of which are hereby incorporated by reference.

TECHNICAL FIELD

This invention relates to a sacrificial film-forming composition having improved storage stability, filling properties and coating uniformity sufficient to form a sacrificial film, a patterning process, a sacrificial film formed from the composition, and a method of removing the sacrificial film.

BACKGROUND ART

To comply with the progress of semiconductor integrated circuits toward higher degrees of integration, a technology of processing to smaller feature sizes is needed. In the microfabrication technology of semiconductor devices of the next generation based on ULK/copper interconnection, a material-friendly processing technique is needed in order to make effective use of materials having insufficient chemical and physical strengths. In particular, the technique of processing porous silicon base low-dielectric materials having a relative permittivity of up to 2.7 requires engineers to review and tailor the steps in the overall process including cleaning, etching and CMP and to look for novel materials suited therefor.

For example, in connection with the dual-damascene manufacture by via-first process, Richard Spear et al. proposed spin-on-glass materials as the anti-reflective coating/filling material in JP-A 2003-502449, U.S. Pat. No. 6,268,457 and U.S. Pat. No. 6,506,497. Also a spin-on-glass material having no anti-reflective effect was proposed as the low-dielectric constant film-forming filling material. The spin-on-glass materials have a high structural similarity to the silica base low-dielectric constant film and raise no problem in pattern shape during fluorocarbon gas dry etching, but fail to establish a selectivity during wet etching and are difficult to control the shape after stripping. On the other hand, when organic materials are used as the filling material, they tend to generate shape abnormalities in proximity to the interface between the organic film and the low-dielectric constant film during fluorocarbon gas dry etching for low-dielectric constant material processing after the oxygen gas dry etching step.

SUMMARY OF THE INVENTION

An object of the present invention is to provide a novel sacrificial film-forming composition which can solve all the above-discussed problems in the processing of silicon-base low-dielectric constant film having a relative permittivity of up to 2.7, a patterning process using the composition, a sacrificial film formed from the composition, and a method of removing the sacrificial film.

The inventors recognized through the past investigations that a silicone base material provides a satisfactory etching selectivity relative to an organic material. However, among silicon base materials, silicone base materials are unlikely to establish a satisfactory selectivity therebetween especially on dry etching, and are difficult to establish a satisfactory selective ratio therebetween even on wet etching unless there is a substantial difference in degree of condensation. Even when a material having a low degree of condensation is used, the degree of condensation increases through the etching and baking steps so that a selective ratio of etching is not so high as expected.

Regarding resins composed mainly of silicone base materials, the inventors found that organofunctional groups are previously incorporated into siloxanes, and siloxanes having undergone polymerization to a certain extent are crosslinked together by utilizing those organofunctional groups, whereby storage stability is dramatically enhanced, as compared with the prior art spin-on-dielectric (SOD) type resins which undergo polymerization/crosslinking solely by way of siloxane bonds (see Japanese Patent Application No. 2003-157807). Continuing investigations, the inventors have discovered that due to the effect of organic structures introduced into silicone base materials by way of crosslinking, a selectivity is established between one and other silicone base materials especially on wet etching; and that a wet etching rate is accelerated by thermal decomposition of organic crosslinked moieties. The present invention is predicated on these discoveries.

Accordingly, the present invention provides a sacrificial film-forming composition, a patterning process, a sacrificial film and a sacrificial film removing method, which are defined below.

[1] A sacrificial film-forming composition comprising (A) 100 parts by weight of an organofunctional silicone resin which is a co-hydrolytic condensate of a hydrolyzable silane having the general formula (1) and a hydrolyzable silane having the general formula (2) and/or (3) or a modification of the co-hydrolytic condensate,

$$X-Y-SiZ_3 \quad (1)$$

wherein Z is a hydrolyzable group such as an alkoxy, acetoxy, amino, alkylamino or halogen group; X is a crosslinkable organofunctional group such as a hydroxyl group which may be substituted with an acid or thermally labile functional group, a substituted or unsubstituted epoxy group, a substituted or unsubstituted acyloxy group or a substituted or unsubstituted acryloxy group, or a functional group which can be modified into such a crosslinkable organofunctional group; and Y is a single bond or a substituted or unsubstituted divalent (or trivalent when bonded to both two carbon atoms of an epoxy group) hydrocarbon group which may have an ether bond, ester bond or saturated cyclic structure in its structure, with the proviso that Y is not a single bond when X is a hydroxyl group,

$$R_nSiZ_{4-n} \quad (2)$$

wherein Z is a hydrolyzable group and may be identical with or different from Z in formula (1), R is hydrogen or a substituted or unsubstituted monovalent hydrocarbon group which does not undergo crosslinking reaction with other organic groups, and n is an integer of 0 to 3,

$$P-SiZ_3 \quad (3)$$

wherein Z is a hydrolyzable group and may be identical with or different from Z in formulae (1) and (2), and P is a substituent group which readily decomposes and volatilizes upon thermal decomposition, said organofunctional silicone resin having a weight average molecular weight of at least 500, (B) 0 to 20 parts by weight of a crosslinking agent,
(C) 0.001 to 5 parts by weight of an acid generator,
(D) 5 to 400 parts by weight of an extender or an organic resin component which readily decomposes and volatilizes upon heating, with the proviso that the amount of component (D) is 0 to 400 parts by weight when component (A) contains units derived from formula (3), and
(E) 100 to 50,000 parts by weight of an organic solvent.

[2] The composition of [1], wherein the crosslinking agent (B) is present in an amount of at least 1 part by weight per 100 parts by weight of component (A) and reacts with the crosslinkable organofunctional group in formula (1) in the presence of an acid catalyst to provide a curing ability to component (A).

[3] The composition of [1], wherein the crosslinkable organofunctional groups on the organofunctional silicone resin (A) provide a curing ability by inducing crosslinking reaction between identical or different silicone resins in the presence of an acid catalyst.

[4] The composition of [1], wherein component (A) has a thermally decomposable structure incorporated therein.

[5] The composition of [1], wherein component (A) has a UV-absorbing structure incorporated therein.

[6] A process of forming a pattern on a substrate by lithography, comprising the steps of:
applying the sacrificial film-forming composition of any one of [1] to [4] onto a substrate having a low-dielectric constant material film formed thereon,
baking the composition to form a sacrificial film,
forming an antireflective film on the sacrificial film when a UV-absorbing structure is not incorporated in component (A),
applying a photoresist material,
prebaking the material to form a photoresist film,
exposing the photoresist film to a pattern of light,
developing the photoresist film with a developer to form a resist pattern in the photoresist film,
etching the antireflective film, the sacrificial film and the low-dielectric constant material film through the resist pattern serving as a mask, and
dissolving away the sacrificial film in a stripping solution, thereby forming a pattern on the substrate.

[7] A process of forming a pattern on a substrate by lithography, comprising the steps of:
applying the sacrificial film-forming composition of any one of [1] to [4] onto a substrate having a low-dielectric constant material film formed thereon,
baking the composition to form a sacrificial film,
forming an antireflective film on the sacrificial film when a UV-absorbing structure is not incorporated in component (A),
applying a photoresist material,
prebaking the material to form a photoresist film,
exposing the photoresist film to a pattern of light,
developing the photoresist film with a developer to form a resist pattern in the photoresist film,
etching the antireflective film, the sacrificial film and the low-dielectric constant material film through the resist pattern serving as a mask,
effecting plasma treatment, and
dissolving away the sacrificial film in a stripping solution, thereby forming a pattern on the substrate.

[8] A process of forming a pattern on a substrate by lithography, comprising the steps of:
applying the sacrificial film-forming composition of [5] onto a substrate having a low-dielectric constant material film formed thereon,
baking the composition to form a sacrificial film,
applying a photoresist material,
prebaking the material to form a photoresist film,
exposing the photoresist film to a pattern of light,
developing the photoresist film with a developer to form a resist pattern in the photoresist film,
etching the sacrificial film and the low-dielectric constant material film through the resist pattern serving as a mask, and
dissolving away the sacrificial film in a stripping solution, thereby forming a pattern on the substrate.

[9] A process of forming a pattern on a substrate by lithography, comprising the steps of:
applying the sacrificial film-forming composition of [5] onto a substrate having a low-dielectric constant material film formed thereon,
baking the composition to form a sacrificial film,
applying a photoresist material,
prebaking the material to form a photoresist film,
exposing the photoresist film to a pattern of light,
developing the photoresist film with a developer to form a resist pattern in the photoresist film,
etching the sacrificial film and the low-dielectric constant material film through the resist pattern serving as a mask,
effecting plasma treatment, and
dissolving away the sacrificial film in a stripping solution, thereby forming a pattern on the substrate.

[10] A process of forming a pattern on a substrate by lithography, comprising the steps of:
applying the sacrificial film-forming composition of [5] onto a substrate having a low-dielectric constant material film formed thereon,
baking the composition to form a sacrificial film,
applying a photoresist material,
prebaking the material to form a photoresist film,
exposing the photoresist film to a pattern of light,
developing the photoresist film with a developer to form a resist pattern in the photoresist film,
etching the sacrificial film and the low-dielectric constant material film through the resist pattern serving as a mask,
effecting heat treatment, and
dissolving away the sacrificial film in a stripping solution, thereby forming a pattern on the substrate.

[11] A sacrificial film which is obtained by applying the sacrificial film-forming composition of any one of [1] to [5] onto a substrate and baking the composition.

[12] A method of removing a sacrificial film, comprising the step of treating the sacrificial film of [11] with an acidic or basic stripping solution for dissolving away the sacrificial film at a high selectivity relative to an underlying layer of low-dielectric constant material film.

The sacrificial film-forming composition of the invention has excellent storage stability, filling properties, adhesion, and coating uniformity, and forms a sacrificial film which is effectively dissolvable in a stripping solution. The composition is effective for increasing the precision during processing of ultra low-k (ULK) film.

DESCRIPTION OF THE PREFERRED EMBODIMENTS

Figure 1:
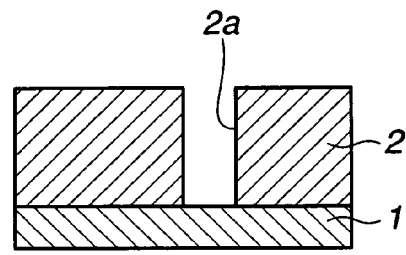
FIG. 1 is a cross-sectional view of a substrate having a patterned low-dielectric constant material film.

The silicone resin used herein is obtainable through co-hydrolysis and condensation of a hydrolyzable silicon compound having the general formula (1) and a hydrolyzable silicon compound having the general formula (2) and/or (3).

$$X—Y—SiZ_3 \quad (1)$$

Herein Z is a hydrolyzable group such as an alkoxy, acetoxy, amino, alkylamino or halogen group; X is a crosslinkable organofunctional group such as a hydroxyl group which is substituted or not substituted with an acid or thermally labile functional group, a substituted or unsubstituted epoxy group, a substituted or unsubstituted acyloxy group or a substituted or unsubstituted acryloxy group, or a functional group which can be modified into such a crosslinkable organofunctional group; and Y is a single bond or a substituted or unsubstituted divalent (or trivalent when bonded to both two carbon atoms of an epoxy group) hydrocarbon group which may have an ether bond, ester bond or saturated cyclic structure in its structure, with the proviso that Y is not a single bond when X is a hydroxyl group.

$$R_nSiZ_{4-n} \quad (2)$$

Herein Z is a hydrolyzable group and may be identical with or different from Z in formula (1), R is hydrogen or a substituted or unsubstituted monovalent hydrocarbon group which does not undergo crosslinking reaction with other organic groups, and n is an integer of 0 to 3.

$$P—SiZ_3 \quad (3)$$

Herein Z is a hydrolyzable group and may be identical with or different from Z in formulae (1) and (2), and P is a substituent group which readily decomposes and volatilizes upon thermal decomposition.

X is a functional group capable of crosslink-forming reaction utilizing as a catalyst the acid that is generated by the acid generator upon heating after the inventive composition is applied. Y is an organic group that links X to the silicon of a polymer chain. There can be a situation where two or more crosslinkable organofunctional groups are bonded to one Y. However, since no substantial change of handling is necessary from the technical aspect, the above definition is interpreted such that one crosslinkable organofunctional group is designated by X and the other crosslinkable organofunctional group is another substituent group. It should be technically understood that the crosslinking density, which will be described later, is calculated on the assumption that even when two crosslinkable organofunctional groups are bonded to one Y, one crosslink is formed.

Of the groups represented by X, the hydroxyl group which is substituted with an acid or thermally labile functional group is a functional group which is decomposed by heating to form a film after the sacrificial film-forming composition is applied, to regenerate a hydroxyl group which, in turn, can react with a crosslink-forming reactive group on another polymer or crosslinking agent, to form a crosslink. The protective group which is labile to acid or heat may be any of acid-decomposable protective groups which are commonly used in organic synthesis. Preferred protective groups are acetal and ketal groups, and typical examples include methoxymethyl, ethoxymethyl, propoxymethyl, isopropoxymethyl, butoxymethyl, t-butoxymethyl, cyclohexyloxymethyl, 1-ethoxyethyl, 1-methoxyethyl, 1-propoxyethyl, 1-isopropoxyethyl, 1-butoxyethyl, 1-t-butoxyethyl, 1-cyclohexyloxyethyl, 1-methoxy-1-propyl, 1-ethoxy-1-propyl, 1-propoxy-1-propyl, 1-isopropoxy-1-propyl, 1-butoxy-1-propyl, 1-t-butoxy-1-propyl, and 1-cyclohexyloxy-1-propyl. For 1,2- or 1,3-diol, ketal may be utilized, with a typical example being acetonide. In addition, tertiary alkyl groups may be used as the acid- or heat-labile protective group for hydroxyl group, with typical examples including t-butoxy, t-amyloxy, and neopentyloxy.

The epoxy group is a most preferred substituent group which has a high storage stability and readily reacts with another crosslinkable substituent group or epoxy group itself to form a crosslink. The epoxy group can be introduced at the end of a chain-like skeleton pendant from silicon, like a 2,3-epi-1-propoxy group. The epoxy group can also be introduced in the form of an epoxy group having a substituent group on the side thereof opposite to the silicon side, that is, at an intermediate of the pendant. When the epoxy group is introduced in such a chain-like form, the corresponding Y in formula (1) becomes a divalent organic group. Moreover, the epoxy group can be introduced into a cyclic skeleton bonded to silicon as a pendant or a cyclic skeleton bonded to silicon via a spacer, like an epoxycyclohexyl skeleton or epoxynorbornyl skeleton. When such an epoxy group introduced into a cyclic structure is represented by X, Y is a trivalent organic group.

The acyloxy groups include acetyl, propionyl, and butanecarboxy groups while t-butoxycarbonyloxy and analogues are useful.

The substituted or unsubstituted acryloxy groups include acrylic and methacrylic groups. The acryloxy groups may have substituent groups at alpha and beta-positions, and such substituent groups may bond together to form a ring.

When it is desired to additionally impart a UV absorbing function to the sacrificial film of the invention, the hydroxyl group may be used in a form bonded to a phenyl, naphthyl or anthranyl group. In this case, the hydroxyl group may serve not only as a crosslinkable group, but also as an active group to help the aromatic group to undergo crosslinking reaction. It is noted that the amount of aromatic group, if introduced, must be carefully controlled because the introduction of an aromatic group significantly reduces the dry etching rate of a sacrificial film.

The structure of Y is not particularly limited. Since it is undesired that the sacrificial film of the invention has a reduced etching rate when etched with a fluoride gas plasma, Y is preferably selected from aliphatic groups if not for the purpose of providing ultraviolet absorption. When a plasma treatment or thermal decomposition step, which will be described later, is added prior to the removal step in order that the sacrificial film layer be readily dissolved away, it is effective to add an amount of a ring structure-free silane so that the purpose may be attained under milder conditions. This is because in the case of plasma treatment, an increased carbon density enhances the plasma resistance of organic groups. In the case of thermal decomposition, the same effect is observed as a result of the instant research work. The additional requirement that is advantageous to thermal decomposition is that X is a hydroxyl or epoxy group. Another advantageous crosslinking reactive structure is an acrylic structure which is substituted or unsubstituted at the carbon of vinyl group on the carbonyl side.

On the other hand, if a cyclic structure is incorporated into Y, the resulting resin is believed to have a higher Tg, is easy to handle in synthesis and forms a film which is unsusceptible to intermixing. For this reason, a final composition for a particular application is determined after analysis of a number of combinations.

Functional groups of the following formulae are representative of the X—Y—Si structure in formula (1). Herein and throughout the specification, Me is methyl, Ac is acetyl, and Et is ethyl.

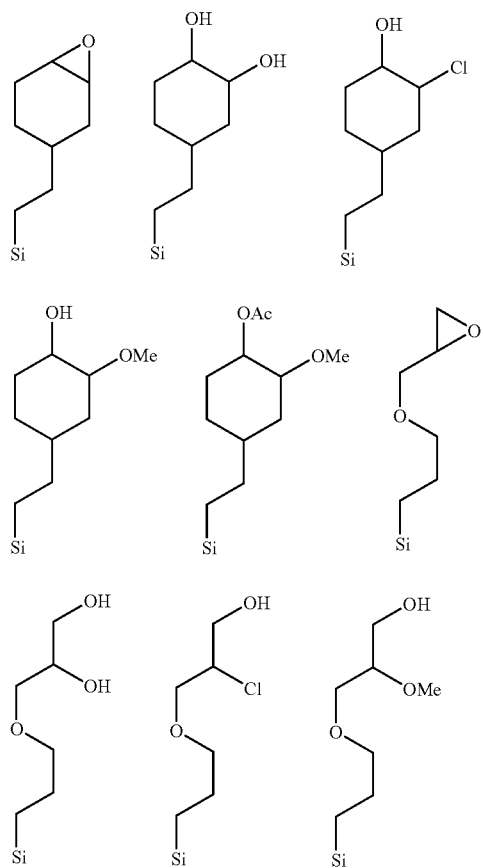

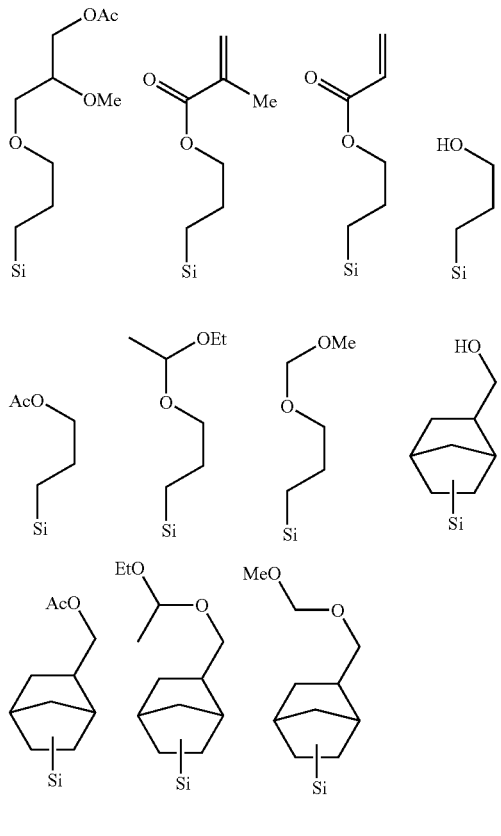

Structures of the following formulae are representative of the $SiZ_3$ structure in formula (1). Herein and throughout the specification, Pr is propyl, Bu is butyl, and tBu is tert-butyl.

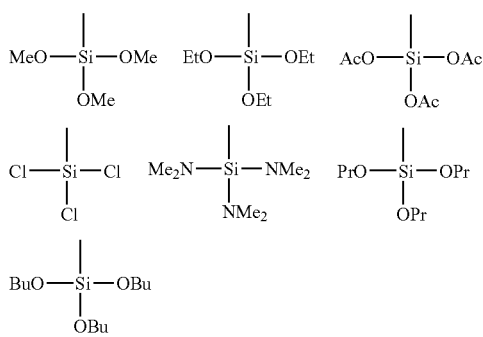

Specific examples of the hydrolyzable silicon compound of formula (1) include epoxysilanes, carbinol type silanes and silanes of the type whose hydroxyl group is protected, ester type silanes, enolate type silanes, and derivatives thereof, as shown by the following formulae.

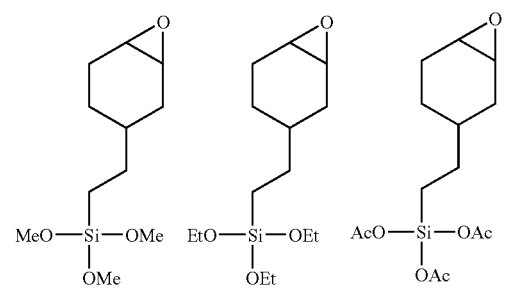
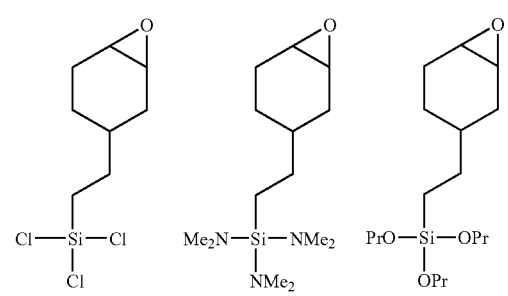
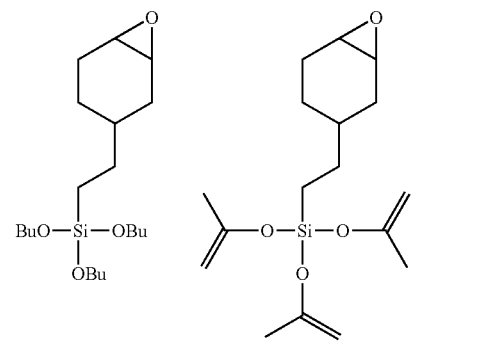
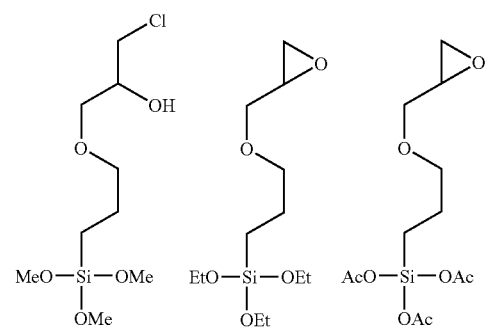
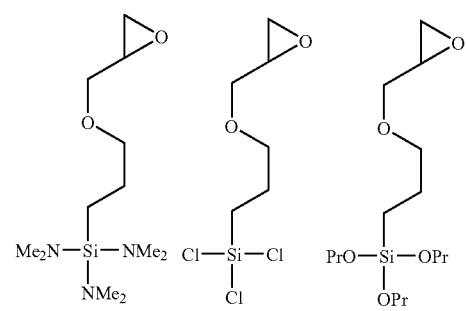
-continued
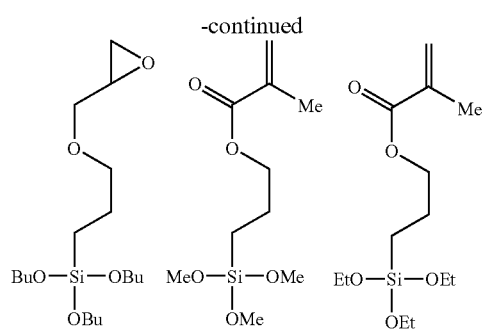
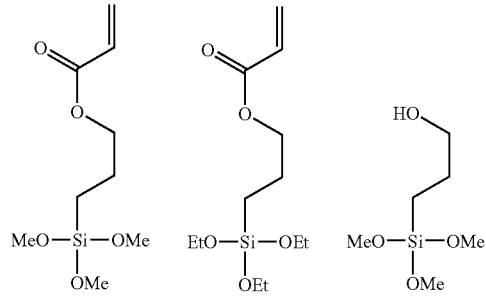
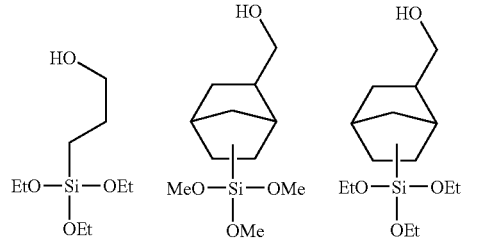
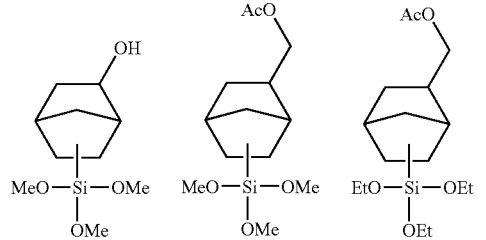
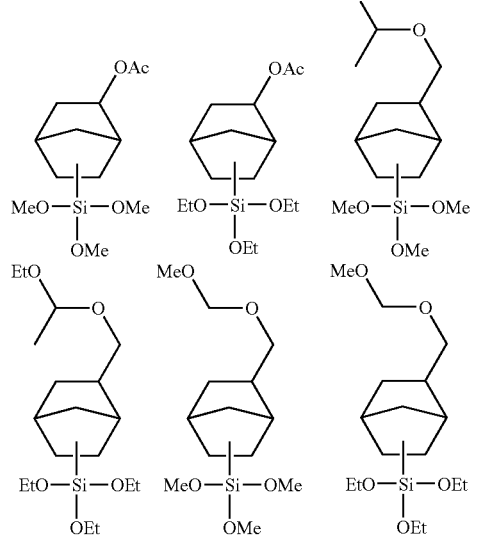

-continued

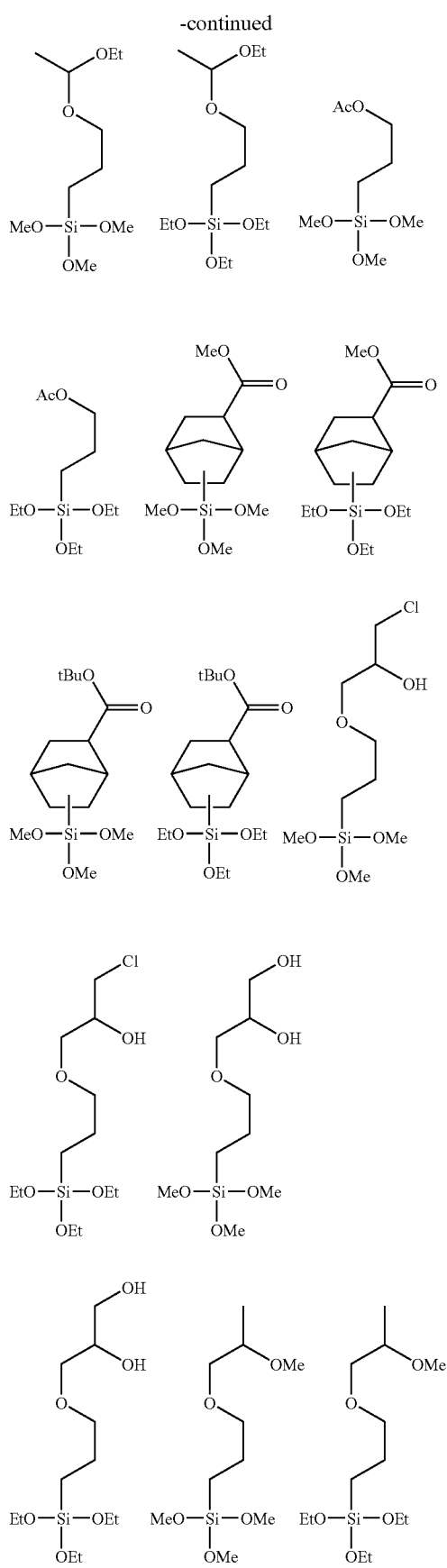

-continued

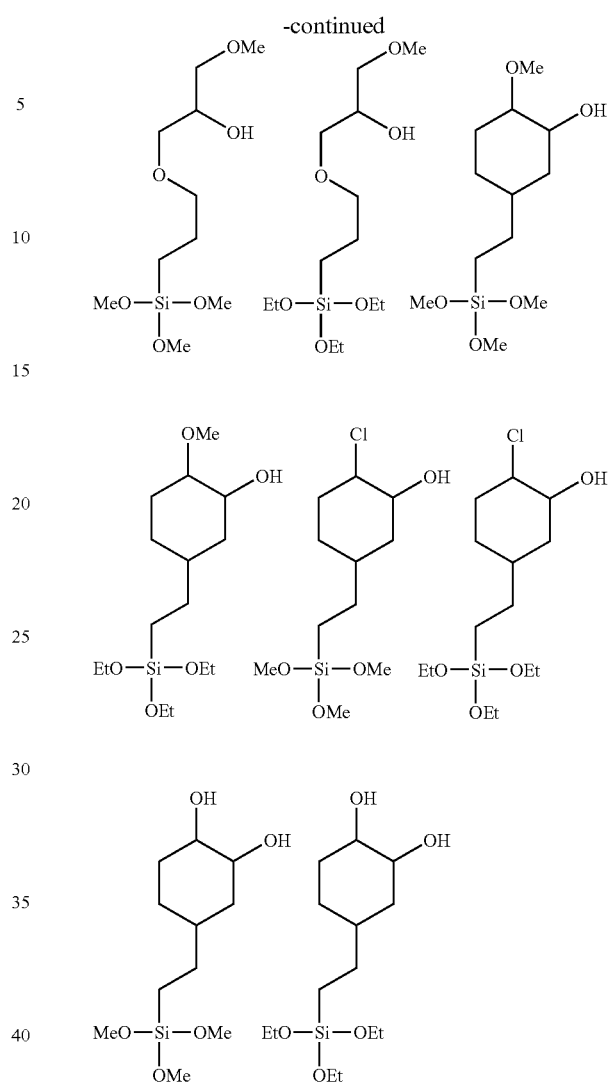

In the hydrolyzable silane compounds of formula (2), X is as defined above. R is hydrogen or a substituted or unsubstituted monovalent hydrocarbon group which does not undergo crosslinking reaction with other organic groups. The monovalent hydrocarbon group represented by R is not particularly limited as long as it is not active to crosslinking reaction by the acid and heat associated with film formation after the inventive composition is applied to a substrate (to be processed). In addition to a hydrogen atom and straight, branched or cyclic alkyl groups, a choice may also be made of alkyl groups having oxygen functional groups, such as alkyl groups substituted with alkoxy groups which are not thermally or acid labile, alkyl groups having halogen or cyano groups, and alkyl groups having silyl or siloxy groups.

The units of the general formula (2) are incorporated to prevent the phenomenon that if too much organic crosslinks form between silicone resins in a sacrificial film, the final step of dissolving the sacrificial film in a stripping solution becomes difficult. The structure of R affects the etching rate of the sacrificial film during dry etching. The dry etching for processing a silicon base low-dielectric constant material film with which the sacrificial film of the invention is most effectively utilized is generally carried out under conditions using a fluorochemical gas. With respect to the dry etching with fluorochemical gas, the sacrificial film of the invention preferably has an etching rate approximately equal to that of a low-dielectric constant material film, as will be described later. Then, an R group substituted with an oxygen functional group such as an alkoxy group of not more than 4 carbon atoms achieves a favorable effect because it functions to enhance an etching rate as compared with an R group free of an oxygen functional group. Like the oxygen functional group, a fluorinated alkyl group also functions to enhance an etching rate. However, if R contains a fluorinated alkyl group alone, there is a risk of losing a balance among the free energy and other parameters of a film or failing to achieve adhesion to another layer. It is generally preferred to combine a fluorinated alkyl group with a group having an oxygen functional group.

R is hydrogen or substituted or unsubstituted monovalent hydrocarbon groups, typically alkyl groups of 1 to 20 carbon atoms, especially 1 to 15 carbon atoms, alkyl groups having an alkoxy group substituted at a position other than 1-position, and halogen-substituted alkyl groups.

Illustrative examples of the silane compound of formula (2), which has an oxygen functional group, include
monofunctional silane compounds such as
3-methoxypropyldimethylmethoxysilane,
3-methoxypropyldimethylethoxysilane,
3-methoxypropyldimethylacetoxysilane,
3-ethoxypropyldimethylmethoxysilane,
3-ethoxypropyldimethylethoxysilane,
3-ethoxypropyldimethylacetoxysilane,
3-propoxypropyldimethylmethoxysilane,
3-propoxypropyldimethylethoxysilane,
3-propoxypropyldimethylacetoxysilane,
(2,3-dimethoxypropyloxy)propyldimethylmethoxysilane,
(2,3-dimethoxypropyloxy)propyldimethylethoxysilane,
(2,3-dimethoxypropyloxy)propyldimethylacetoxysilane,
(2-methoxypropyloxy)propyldimethylmethoxysilane,
(2-methoxypropyloxy)propyldimethylethoxysilane,
(2-methoxypropyloxy)propyldimethylacetoxysilane, etc.;
difunctional silane compounds such as
3-methoxypropylmethyldimethoxysilane,
3-methoxypropylmethyldiethoxysilane,
3-methoxypropylmethyldiacetoxysilane,
3-ethoxypropylmethyldimethoxysilane,
3-ethoxypropylmethyldiethoxysilane,
3-ethoxypropylmethyldiacetoxysilane,
3-propoxypropylmethyldimethoxysilane,
3-propoxypropylmethyldiethoxysilane,
3-propoxypropylmethyldiacetoxysilane,
(2,3-dimethoxypropyloxy)propylmethyldimethoxysilane,
(2,3-dimethoxypropyloxy)propylmethyldiethoxysilane,
(2,3-dimethoxypropyloxy)propylmethyldiacetoxysilane,
(2-methoxypropyloxy)propylmethyldimethoxysilane,
(2-methoxypropyloxy)propylmethyldiethoxysilane,
(2-methoxypropyloxy)propylmethyldiacetoxysilane, etc.;
trifunctional silane compounds such as
3-methoxypropyltrimethoxysilane,
3-methoxypropyltriethoxysilane,
3-methoxypropyltriacetoxysilane,
3-ethoxypropyltrimethoxysilane,
3-ethoxypropyltriethoxysilane,
3-ethoxypropyltriacetoxysilane,
3-propoxypropyltrimethoxysilane,
3-propoxypropyltriethoxysilane,
3-propoxypropyltriacetoxysilane,
(2,3-dimethoxypropyloxy)propyltrimethoxysilane,
(2,3-dimethoxypropyloxy)propyltriethoxysilane,
(2,3-dimethoxypropyloxy)propyltriacetoxysilane,
(2-methoxypropyloxy)propyltrimethoxysilane,
(2-methoxypropyloxy)propyltriethoxysilane,
(2-methoxypropyloxy)propyltriacetoxysilane, etc.

Those silanes in which R is not substituted with an oxygen functional group are also useful as the units of formula (2). Typical examples of readily available silanes include
monofunctional silane compounds such as trimethylchlorosilane, trimethylmethoxysilane, trimethylethoxysilane, trimethyldimethylaminosilane, trimethylacetoxysilane, phenyldimethylchlorosilane, phenyldimethylmethoxysilane, phenyldimethylethoxysilane, phenyldimethyldimethylaminosilane, phenyldimethylacetoxysilane, etc.;

difunctional silane compounds such as dimethyldichlorosilane, dimethyldimethoxysilane, dimethyldiethoxysilane, dimethyldiacetoxysilane, dimethylbis(dimethylamino)silane, phenylmethyldichlorosilane, phenylmethyldimethoxysilane, phenylmethyldiethoxysilane, phenylmethyldiacetoxysilane, phenylmethylbis(dimethylamino)silane, etc.;

trifunctional silane compounds such as methyltrimethoxysilane, methyltriethoxysilane, methyltrichlorosilane, methyltris(dimethylamino)silane, methyltripropoxysilane, methyltributoxysilane, ethyltrimethoxysilane, ethyltriethoxysilane, ethyltrichlorosilane, ethyltris(dimethylamino)silane, ethyltripropoxysilane, ethyltributoxysilane, propyltrimethoxysilane, propyltriethoxysilane, propyltrichlorosilane, butyltrimethoxysilane, butyltriethoxysilane, butyltrichlorosilane, phenyltrimethoxysilane, phenyltriethoxysilane, phenyltrichlorosilane, t-butyltrimethoxysilane, t-butyltriethoxysilane, t-butyltrichlorosilane, neopentyltrimethoxysilane, neopentyltriethoxysilane, neopentyltrichlorosilane, 3,3,3-trifluoropropyltrimethoxysilane, 3,3,3-trifluoropropyltriethoxysilane, 3,3,3-trifluoropropyltrichlorosilane, methyldichlorosilane, methyldimethoxysilane, methyldiethoxysilane, methyldiacetoxysilane, etc.;

tetrafunctional silane compounds such as trimethoxysilane, tetramethoxysilane, tetrachlorosilane, tetraacetoxysilane, tetrapropoxysilane, trichlorosilane, trimethoxysilane, triethoxysilane, etc.

In the hydrolyzable silanes of formula (3), Z is as defined above. P is a substituent group which readily decomposes and volatilizes upon thermal decomposition, examples of which include polyether structure-bearing groups, (meth) acrylic ester structure-bearing groups, and fluorinated alkyl groups. Suitable polyether structures include acetals and (poly)ethylene glycol ethers.

Typical examples of the compound of formula (3) are given below.

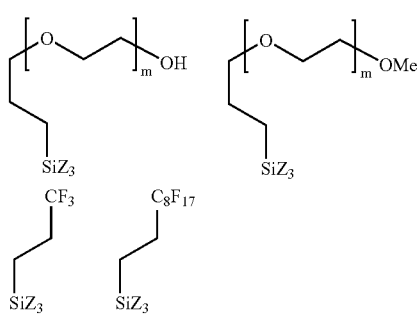

Herein Z is as defined above and m is a number of 1 to 200.

A co-hydrolytic condensate can be synthesized by contacting a mixture of these hydrolyzable silane compounds with water to effect co-hydrolysis and condensation. The reaction may be effected in the presence of an acid catalyst or base catalyst. Also the reaction may be effected in an organic solvent. Examples of the acid catalyst which can be advantageously used in the reaction include hydrochloric acid, nitric acid, acetic acid, oxalic acid, sulfuric acid, methanesulfonic acid, p-toluenesulfonic acid, trifluoroacetic acid, trifluoromethanesulfonic acid, perchloric acid, phosphoric acid, and citric acid. Examples of the base catalyst include ammonia, methylamine, dimethylamine, ethylamine, diethylamine, triethylamine, sodium hydroxide, potassium hydroxide, tetramethylammonium hydroxide, tetrapropylammonium hydroxide, choline, diethylhydroxylamine, DBU and DBN. The organic solvent is preferably selected from polar solvents such as ethanol, IPA, MIBK, acetonitrile, DMA and DMF.

The co-hydrolytic condensate or silicone resin should have a weight average molecular weight (Mw) of at least 500, preferably 1,000 to 100,000, more preferably 2,000 to 10,000, as measured by GPC using polystyrene standards. Too low a Mw interferes with film formation and crosslinking whereas too high a Mw interferes with dissolution.

For the silicone resin as component (A) according to the invention, the resin prepared by the aforementioned method may be modified prior to use. The modification means chemical conversion of functional groups on the resin to different functional groups. For example, for the purpose of controlling crosslinking reactivity, carboxylic acid is reacted with epoxy groups on the resin under basic conditions to convert to α-hydroxycarboxylate. In some examples, hydroxyl groups may be modified with an alkyl halide under basic conditions into non-crosslinkable alkyl ether groups. In a special example, non-crosslinkable 4-methoxybenzyloxy-alkyl groups may be modified under oxidizing conditions into crosslinkable hydroxyalkyl groups.

In one embodiment wherein the silicone resin as component (A) according to the invention is a co-hydrolytic condensate of hydrolyzable silanes of formulae (1) and (2), the content of units derived from the silane of formula (1) significantly affects not only film formation and prevention of intermixing upon coating of an anti-reflective film, but also the dissolution in a stripping solution.

More particularly, once a sacrificial film is formed, an anti-reflective film is coated thereon. If the crosslinking density between silicone resins is too low, intermixing can take place between the sacrificial film and the anti-reflective coating composition, detracting from The function of anti-reflective film. The quantity of crosslinking necessary to prevent intermixing varies somewhat with the molecular weight of a silicone resin used, and, as a measure for implementation, is preferably such that the units derived from the silane of formula (1) are contained in an amount of at least 0.5 mmol, more preferably at least 1 mmol, per gram of the polymer.

On the other hand, the dissolution of the sacrificial film in a stripping solution lowers as the crosslinking quantity increases. To ensure a fully high dissolution rate relative to a silicon base low-dielectric constant material film on a substrate to be processed, the preferred content of the units derived from the silane of formula (1) is up to 3 mmol per gram of the polymer when the sacrificial film is dissolved away in a stripping solution without plasma or heat treatment prior to the stripping. A plasma treatment such as argon plasma treatment is effective for facilitating the dissolution of sacrificial film in a stripping solution. Then, when plasma treatment is followed by treatment with a stripping solution, the preferred content of the units derived from the silane of formula (1) is up to 6 mmol per gram of the polymer. Further, once organic groups are decomposed to some extent by carefully controlling heating conditions so as to prevent formation of ceramic SiC, advantageously the dissolution rate in a stripping solution can be preferentially enhanced. Then, when heat treatment is followed by treatment with a stripping solution, the preferred content of the units derived from the silane of formula (1) is up to 8 mmol per gram of the polymer, more preferably up to 7 mmol per gram of the polymer. It is noted that to meet the above-described necessary physical properties, the proportion of respective constituent units used during co-hydrolysis of silicone polymer is adjusted as follows. In one example of silicone resin which does not contain units of formula (3), 5 to 400 parts by weight of an extender is necessarily used per 100 parts by weight of the silicone polymer, and so, the extender should be included within "gram of the polymer" which is a basis for the content of formula (1) units described in the context of crosslinking quantity. Then, once the amount of extender used is determined, the amount of silicone polymer contained within one "gram of the polymer" is determined. Next, assuming that all hydrolyzable groups on the silanes of formulae (1) and (2) have been converted into Si—O—Si through co-hydrolytic condensation, the composition of component of formula (1) is determined such that the component of formula (1) contained in the silicone polymer is in the above-described millimole range, and the amount of formula (2) used is determined at the same time.

In another example of silicone resin which contains units of formula (3), the amount of the extender and the pendant moiety susceptible to thermal decomposition represented by P in formula (3) is first determined. This range is preferably 5 to 400 parts by weight, relative to the weight of the overall silicone resin minus the weight of P. If the weight of P in formula (3) falls in the above range, the extender may not be used. Next, as in the absence of formula (3), the weight of the extender and the weight of silane units of formula (3) (in which hypothetically, all hydrolyzable groups on the silane units have been converted into Si—O—Si) are subtracted from one "gram of the polymer," and the weight of a silicone resin component based on formulae (1) and (2) per "gram of the polymer" is determined. Thereafter, as in the absence of formula (3), the amount of formula (1) is determined so as to fall in the necessary range of crosslinking quantity, and the amount of formula (2) used is determined.

The crosslinking agent as component (B) is selected from compounds which are reactive with crosslinkable sites on component (A), that is, X (=Organic crosslinkable groups) in formula (1). Note that the use of the crosslinking agent may be omitted if silicone resins are self-polymerizable as in the case where X is an epoxy, methacrylic or acrylic group, or silicone resins are organic crosslinkable with each other as in the case where X is a combination of two or more groups, such as a carboxylic acid group with a hydroxyl group, or an epoxy group with a hydroxyl group. Suitable crosslinking agents include compounds of the following formulae.

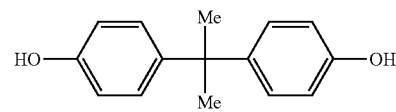

-continued

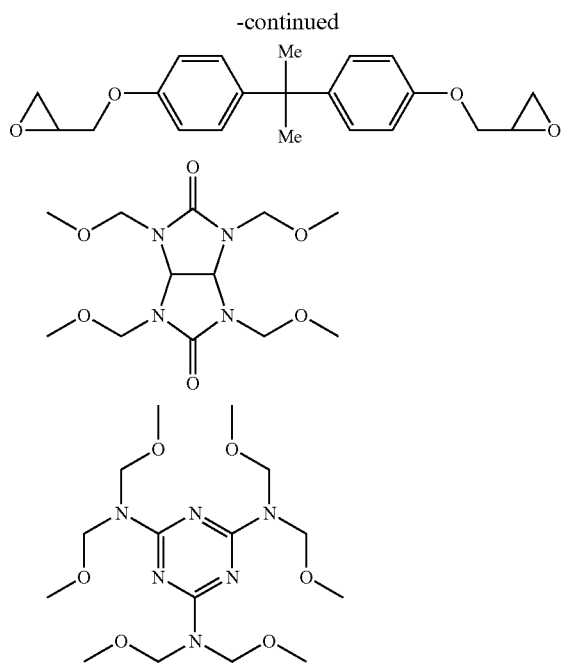

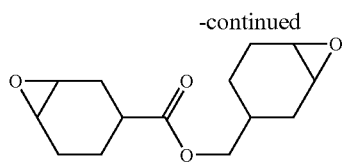

An appropriate amount of component (B) formulated is 0 to 20 parts by weight per 100 parts by weight of component (A) and when used, at least an effective crosslinking amount.

The acid generator as component (C) is a compound which generates an acid upon heating, the acid serving as a catalyst for crosslinking reaction.

The acid generators used herein include onium salts, triazole derivatives, diazomethane derivatives, bissulfone derivatives, glyoximes, and sulfonic acid ester derivatives as shown below by general formulae, with those having a thermal decomposition temperature of up to 220° C. being preferred.

Onium Salts

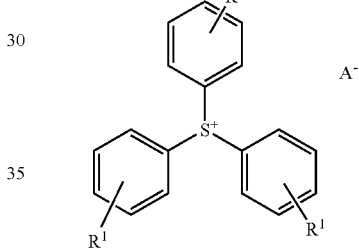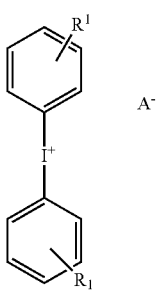

$R^1$ is hydrogen or an organic group such as alkyl or alkoxy.

Triazines

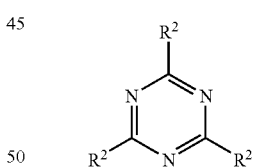

$R^2$ is a partially or entirely halogenated organic group such as alkyl.

Sulfonyldiazomethanes

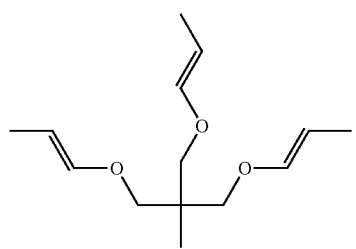

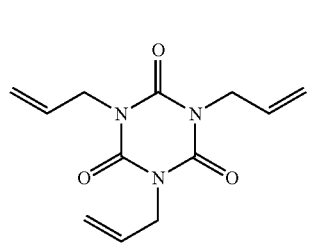

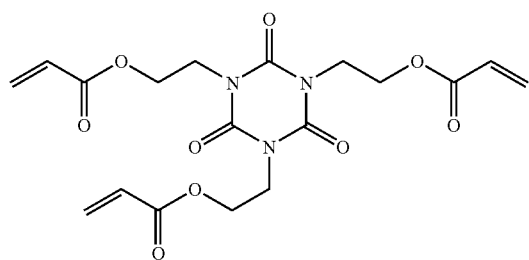

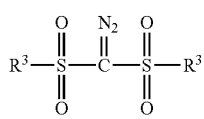

$R^3$ is an organic group.

Disulfones

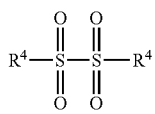

$R^4$ is an organic group such as aryl.

Oximesulfonates

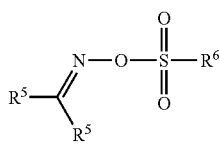

$R^5$ is an organic group, for example, an electron attractive group such as CN, sulfonyloxyimido, carbonyl, or an unsaturated group conjugated therewith, and $R^6$ is hydrogen or an organic group such as alkyl or alkoxy.

Imidosulfonates

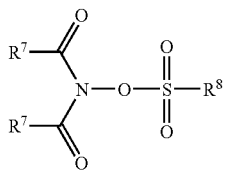

$R^7$ is a monovalent organic group or two $R^7$ bond together to form a ring, and $R^8$ is hydrogen or an organic group such as alkyl or alkoxy.

Of the foregoing formulae, the onium salts, especially triarylsulfonium salts are highly stable during storage and convenient to use among other acid generators. The aromatic groups substituting on the sulfur atom, which are not particularly limited, are preferably phenyl groups which are unsubstituted or optionally substituted with an alkyl or alkoxy group for increased solubility. The counter anions include fluorinated alkylsulfonic acids such as, preferably, trifluoromethanesulfonic acid, perfluorobutanesulfonic acid, perfluorooctanesulfonic acid, and perfluoro-4-ethylcyclohexanesulfonic acid; fluorinated arylsulfonic acids such as perfluorobenzenesulfonic acid; and fluorine-free sulfonic acids such as p-toluenesulfonic acid, butanesulfonic acid and camphorsulfonic acid. With respect to the substituent groups and counter anions, the same is applicable to the diaryliodonium salts (depicted on the right side). Since the diaryliodonium salts are less soluble in organic solvents, the aromatic groups substituting on the iodine atom preferably have alkyl groups substituted thereon.

Triazines substituted with halogenated alkyl groups are also useful as acid generators. In the above formula, $R^2$ is a partially or entirely halogenated alkyl group. Sulfonyldiazomethanes are also useful as acid generators. In the above formula, $R^3$ is a substituent group which may be either aromatic or aliphatic. Disulfones are also useful as acid generators. The substituent groups on disulfones are generally selected from aromatic groups. Oximesulfonates are also useful as acid generators. To ensure storage stability, the carbon which forms a double bond with nitrogen must be electron attractive. Compounds substituted with cyano, perfluoroalkyl or carbonyl groups and glyoxime sulfonate are preferably used. Imidosulfonates are also useful as acid generators. The imide side is often a cyclic imide which is easy to synthesize. Substituent group $R^8$ on the sulfonyl group may be selected from those described for the onium salts.

Typical acid generators are available as commercial reagents. Specific examples are given below by referring to product names in the product list of Midori Kagaku Co., Ltd.: TPS-105, TPS-102, TPS-103, TPS-109, MDS-103, MDS-105, MDS-109, MDS-205, BDS-109, DTS-102, DTS-103, DTS-105, DPI-105, DPI-106, DPI-109, DPI-201, BI-105, MPI-103, MPI-105, MPI-106, MPI-109, BBI-102, BBI-103, BBI-105, BBI-106, BBI-109, BBI-110, BBI-201, TAZ-100, TAZ-101, TAZ-102, TAZ-103, TAZ-104, TAZ-106, TAZ-107, TAZ-108, TAZ-109, TAZ-201, TAZ-203, TAZ-204, TAZ-110, TAZ-113, TA-118, TAZ-122, TAZ-123, TAZ-140, DAM-101, DAM-102, DAM-103, DAM-105, DAM-201, DAM-301, DAM-401, DS-100, DS-101, PAI-01, PAI-101, PAI-106, PAI-1001, NAI-100, NAI-1002, NAI-1003, NAI-1004, NAI-101, NAI-105, NAI-106, NAI-109, NI-100, NI-1002, NI-1003, NI-1004, NI-101, NI-105, NI-106, NI-109, NDI-101, NDI-105, NDI-106, NDI-109, SI-101, SI-105, SI-106, SI-109, PI-105, PI-106, and PI-109.

An appropriate amount of component (C) formulated is 0.001 to 5 parts by weight, preferably 0.5 to 2 parts by weight, per 100 parts by weight of component (A).

In the inventive composition, an extender may be added as component (D) for the purpose of enhancing the etching rate with a fluorocarbon gas plasma. The sacrificial film is required to be etched at an approximately equal etching rate when a ULK material (a material to be processed) is processed by dry etching. Since so-called SOD resins have very close physical properties to ULK materials, the method of removing the SOD material needs a consideration. This may be overcome by using an organic crosslinkable silicone resin as used in prior art silicon base anti-reflective film materials, but the dry etching rate with a fluorocarbon gas plasma is reduced, giving rise to a problem. The extender is added to solve this problem. Polymers having high oxygen and halogen contents and a low carbon content are preferred. Such examples include polyvinyl alcohols, polyacetals, and polycarbohydrates.

Also useful is a thermally decomposable resin (see, for example, JP-A 11-322992, JP-A 2004-51468) which is customarily used to impart porosity to porous ULK films (see, for example, JP-A 11-322992). This resin is also known as "porogen," and has been found to generally have a function of enhancing the dry etching rate with a fluorocarbon gas plasma. In addition to the advantage of dry etching rate adjustment, the porogen can be removed from the sacrificial film layer simply by heating after the processing. Then the removal of the porogen by heating prior to the dissolving away of the sacrificial film in a stripping solution permits the dissolution rate of the sacrificial film in a stripping solution to be increased.

The extender or porogen which can be used herein is preferably an organic polymer having low reactivity with the silicone resin. Examples include polyethers such as polyethylene glycol and polypropylene glycol, (meth)acrylic resins such as polymethyl (meth)acrylate, polyethyl (meth) acrylate, and poly(meth)acrylic acid polyalkylene glycols, and vinylamide resins such as poly(N-vinylacetamide) and poly(N-vinylpyrrolidone). Some polymers which are generally used as the porogen have many aromatic rings therein, but such porogen polymers having aromatic rings are unsuitable in the present application whose main object is to increase the dry etching rate with a fluorocarbon gas plasma, unless a porous film is formed by the film formation step after the coating of the sacrificial film-forming composition.

An appropriate amount of component (D) formulated is 5 to 400 parts by weight per 100 parts by weight of component (A) or silicone resin. When component (A) contains units derived from the silane of formula (3), that is, units having a substituent group P which readily decomposes and volatilizes upon thermal decomposition, component (D) may be omitted. Therefore, in this case, the amount of component (D) is 0 to 400 parts by weight, and preferably 1 to 400 parts by weight.

In the inventive composition, an organic solvent is used as component (E). The organic solvent used herein is not particularly limited as long as it allows components (A) to (D) to be uniformly dissolved and preferably has a boiling point of up to 200° C. Examples include ethyl lactate (EL), propylene glycol monoethyl ether acetate (PGMEA), propylene glycol monoethyl ether (PGME), cyclohexanone, toluene, xylene, anisole, ethylene glycol, methyl isobutyl ketone (MIBK), and propylene glycol propyl ether (PnP).

An appropriate amount of component (E) formulated is 100 to 50,000 parts by weight, preferably 100 to 10,000 parts by weight, more preferably 200 to 5,000 parts by weight, per 100 parts by weight of component (A).

The sacrificial film-forming composition of the invention permits a thermally labile structure to be incorporated in an organic crosslinkable portion. The thermally labile structure can be incorporated in a crosslinkable portion of component (A) or the structure of a crosslinking agent as component (B) or both. The thermally labile structures include an ether structure, ester structure and amide structure. Specific examples include crosslinkable portions (A) and crosslinking agents (B) of the following formulae.

(A) Thermally Labile, Crosslinkable Portions (B) Thermally Labile Crosslinking Agents

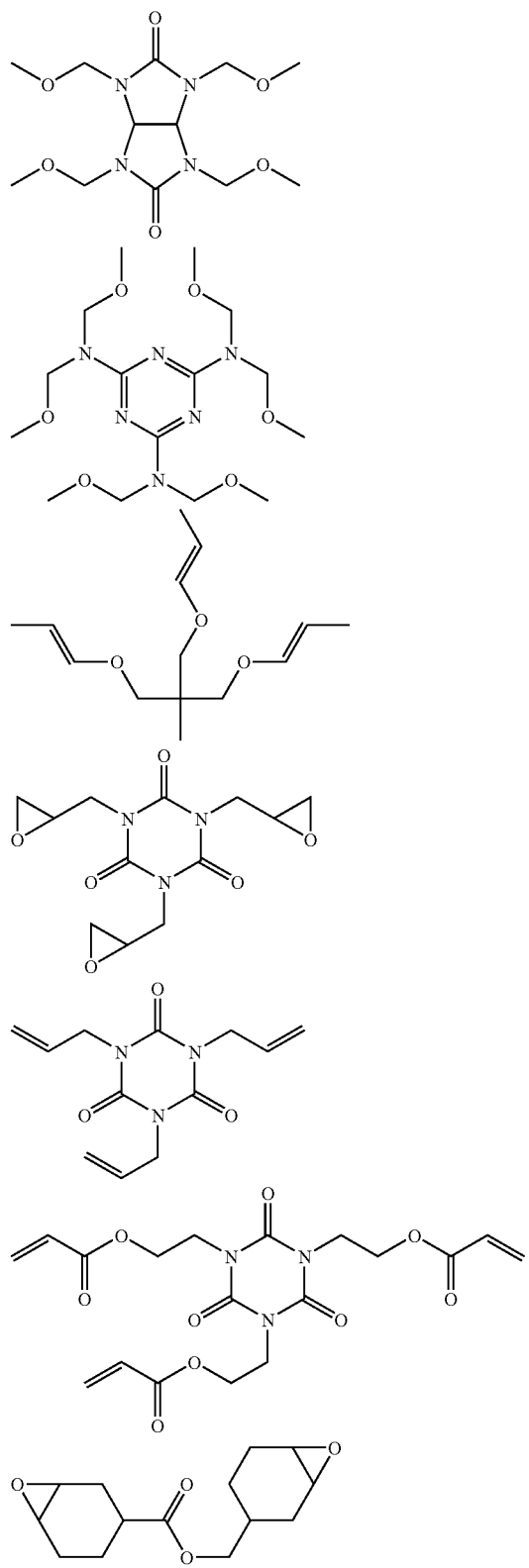

If heat treatment is effected before the sacrificial film is dissolved away in a stripping solution, the extender is decomposed to promote the subsequent dissolution of the sacrificial film in the stripping solution. If crosslinks in the sacrificial film are additionally decomposed, this will further promote the dissolution. To achieve this effect to a full extent, at least 30% of the entire crosslinking agent must comprise thermally labile crosslinks. It is possible that all the crosslinking agent be thermally labile crosslinks, but the resulting silicone polymer has a lower Tg and becomes difficult to handle. Thus all the crosslinking agent need not be thermally labile crosslinks.

Furthermore, a UV-absorbing structure can be incorporated into component (A). A number of reports are known regarding the introduction of UV-absorbing structure into silicone polymers. The object is attained by incorporating phenyl, naphthyl, anthranyl or similar groups. However, since an aromatic compound acts to significantly lower the etching rate with a fluorocarbon gas plasma, it is undesired to add such groups in an amount of more than 20 mol % of the resin constituent units.

In the composition of the invention, surfactants and other additives may be formulated if desired. A nonionic surfactant is preferred, examples of which include perfluoroalkyl polyoxyethylene ethanols, fluorinated alkyl esters, perfluoroalkylamine oxides, perfluoroalkyl EO-addition products, and fluorinated organosiloxane compounds. Illustrative examples include Fluorad FC-430 and FC-431 from Sumitomo 3M Ltd., Surflon S-141, S-145, KH-10, KH-20, KH-30 and KH-40 from Asahi Glass Co., Ltd., Unidyne DS-401, DS-403, and DS-451 from Daikin Industries Ltd., Megaface F-8151 from Dainippon Ink & Chemicals, Inc., and X-70-092 and X-70-093 from Shin-Etsu Chemical Co., Ltd. Preferred surfactants include Fluorad FC-430 from Sumitomo 3M Ltd., KH-20 and KH-30 from Asahi Glass Co., Ltd., and X-70-093 from Shin-Etsu Chemical Co., Ltd.

Referring to the figures, a process of forming a pattern using the sacrificial film-forming composition of the invention is described.

Figure 2:
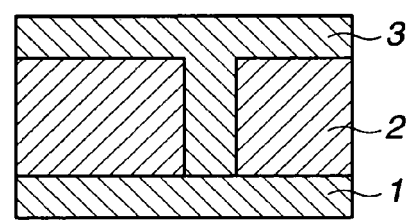
FIG. 2 is a cross-sectional view of a sacrificial film formed on the low-dielectric constant material film.

A low-dielectric constant material film 2 is formed on a planar substrate 1, a deep bore or channel 2a is opened in the film 2 by a conventional technique using photoresist, and the photoresist is peeled off. This results in the structure of FIG. 1. To process the low-dielectric constant material film 2 over a different area without damaging the substrate the bore or channel 2a must be once filled as shown in FIG. 2. It is a sacrificial film 3 of the invention that serves to fill in the bore or channel 2a.

The sacrificial film 3 is formed by applying and baking the sacrificial film-forming composition of the invention. The thickness of the sacrificial film may be suitably selected and is generally in a range of 0.1 to 3.0 µm, preferably 0.5 to 1.0 µm. Preferred baking conditions include a temperature of 120 to 250° C. and a time of 30 seconds to 5 minutes.

Figure 3:
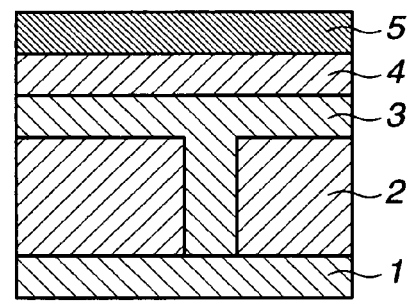
FIG. 3 is a cross-sectional view of an anti-reflective film and a photoresist film formed on the sacrificial film.

Next, as shown in FIG. 3, an anti-reflective film 4 is formed on the sacrificial film 3, and a photoresist material is then applied and prebaked to form a photoresist film 5. For the anti-reflective film 4 and the photoresist film 5, well-known materials may be used, the films may be formed by conventional techniques, and their thickness may be suitably selected.

Figure 4:
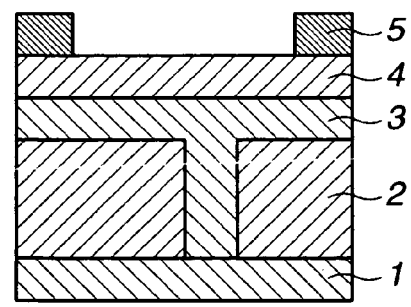
FIG. 4 is a cross-sectional view of a patterned photoresist film.
Figure 5:
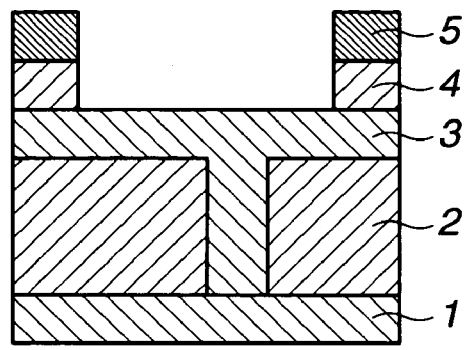
FIG. 5 is a cross-sectional view of a patterned anti-reflective film.

Then, the photoresist film 5 is exposed to a pattern of light in a conventional manner, and developed with a developer liquid to form a pattern in the photoresist film 5, as shown in FIG. 4. Then, as shown in FIG. 5, using the patterned photoresist film 5 as a mask, dry etching is carried out to form a pattern in the anti-reflective film 4.

Figure 6:
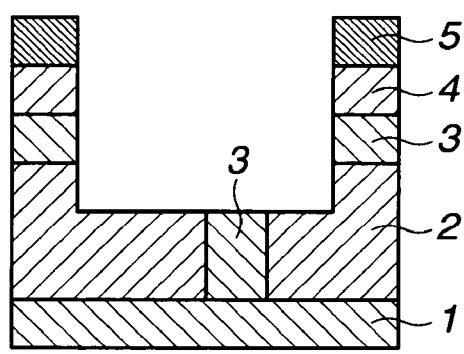
FIG. 6 is a cross-sectional view of a patterned sacrificial film/low-dielectric constant material film structure.

Next, as shown in FIG. 6, the sacrificial film 3 and low-dielectric constant material film 2 are dry etched to form a pattern therein. The dry etching used herein is preferably etching with a fluoride gas plasma. It will be understood that if the sacrificial film 3 and low-dielectric constant material film 2 have largely different etching rates during this process, a portion of the low-dielectric constant material film 2 in proximity to the bore or channel filled with the sacrificial film 3 cannot be processed to the designed depth as compared with the remaining portion. In this regard, it is preferred to match the etching rate of the sacrificial film by tailoring the carbon content, oxygen functional group and other parameters of the sacrificial film, or by introducing fluorine atoms. It is then preferred to select so the constituent materials of the silicone resin and the type and amount of the extender in the sacrificial film-forming composition.

Figure 7:
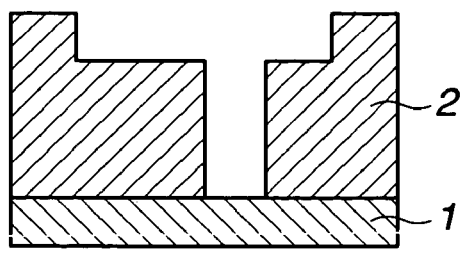
FIG. 7 is a cross-sectional view of a structure after the photoresist film, anti-reflective film and sacrificial film are removed.
Figure 8:
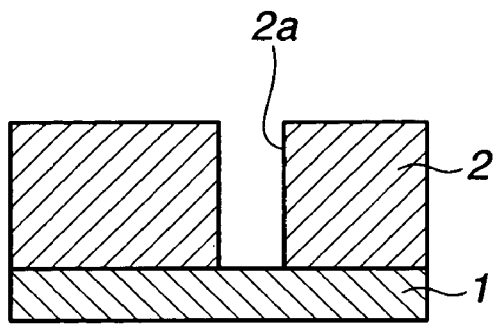
FIG. 8 is a cross-sectional view of a substrate having a patterned low-dielectric constant material film.

Thereafter, as shown in FIG. 7, the residues of the photoresist film 5, anti-reflective film 4 and sacrificial film 3 are removed using a stripping solution. The stripping solution used herein may be either acidic or basic. Examples include dilute hydrofluoric acid, ammonium fluoride solution, buffer type hydrofluoric acid solution, EKC-680 and EKC-5920 by EKC Technologies, AP-811 by ATMI, trimethylammonium hydroxide solution, EKC-2255 by EKC Technologies, and ELM-C20-200 and ELM-R10 by Mitsubishi Gas Chemical Co., Ltd.

Figure 9:
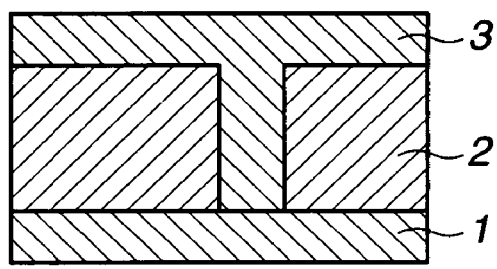
FIG. 9 is a cross-sectional view of a sacrificial film formed on the low-dielectric constant material film, the sacrificial film having a UV-absorbing structure incorporated therein.
Figure 10:
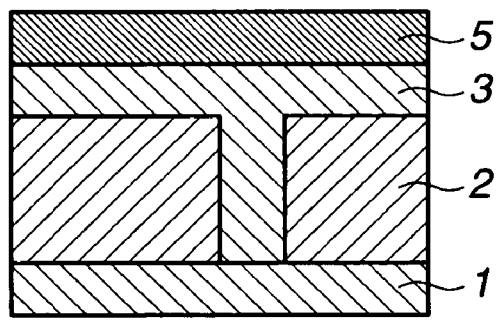
FIG. 10 is a cross-sectional view of a photoresist film formed on the sacrificial film.
Figure 11:
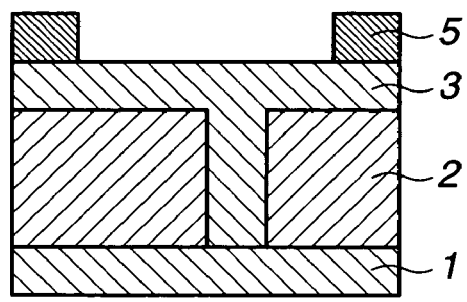
FIG. 11 is a cross-sectional view of a patterned photoresist film.

When the sacrificial film 3 has a UV-absorbing structure incorporated therein, the sacrificial film 3 is formed on the low-dielectric constant material film as shown in FIG. 9, and the photoresist film 5 is formed directly on the sacrificial film 3 as shown in FIG. 10. Then, the photoresist film 5 is exposed to a pattern of light in a conventional manner, and developed with a developer liquid to form a pattern in the photoresist film 5, as shown in FIG. 11.

Figure 12:
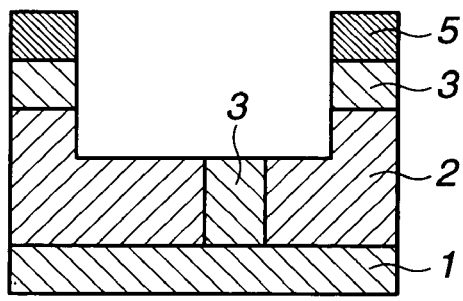
FIG. 12 is a cross-sectional view of a patterned sacrificial film/low-dielectric constant material film structure.
Figure 13:
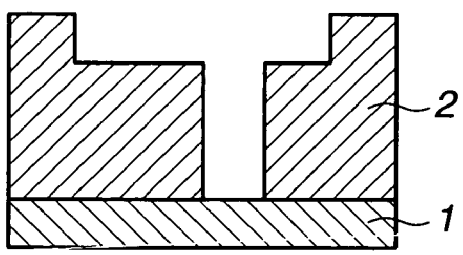
FIG. 13 is a cross-sectional view of a structure after the photoresist film and sacrificial film are removed.

Next, as shown in FIG. 12, the sacrificial film 3 and low-dielectric constant material film 2 are dry etched using the patterned photoresist film 5 as a mask, in the same manner as in FIG. 6. Thereafter, as shown in FIG. 13, the residues of the photoresist film 5 and sacrificial film 3 are removed using a stripping solution, in the same manner as in FIG. 7.

When the extender is water soluble, typically due to the inclusion of more polyvinyl alcohol structure, a sacrificial film in which the silicone resin has a reduced crosslinking density exhibits a fully high dissolution rate as compared with the low-dielectric constant material film without a need for special treatment prior to the treatment with a stripping solution, so that the sacrificial film can be dissolved away without damaging the low-dielectric constant material film. By contrast, a sacrificial film in which the silicone resin has an increased crosslinking density of about 4 mmol/gram of polymer is difficult to provide a sufficient differential dissolution rate unless a special treatment intervenes. As used herein, the term "crosslinking density" refers to the value based on the hypothesis that all hydrolyzable silanes used as polymer raw materials have been hydrolyzed to form Si—O—Si linkages and all crosslinkable groups incorporated have formed crosslinks. So this "crosslinking density" does not represent the actual physical amount in the film, but this value can be used as a measure of crosslinking.

One effective technique of establishing a differential dissolution rate is a plasma treatment that removes the organic component to some extent. For the plasma type, inert gases may be used, because treatment with an argon gas plasma, for example, is effective for increasing the reaction rate without inducing subordinate reactions. The use of plasma treatment can comply with a crosslinking density of up to about 7 mmol/gram of polymer, which suggests a possible choice of a sacrificial film which is unlikely to raise the problem of intermixing between the sacrificial film and the anti-reflective film.

The method of stripping the sacrificial film which can make best use of the effect of porogen addition involves, prior to the treatment with a stripping solution, heat treatment for decomposing the crosslinks between the porogen and the silicone resin to some extent. The above-described plasma treatment may be additionally effected before or after this heat treatment. In the event that the amount of units derived from the silane of formula (1) is up to 8 mmol per gram of the resin in a sacrificial film-forming composition, the dissolution rate of the sacrificial film in a stripping solution can be increased by heating at 180 to 400° C. within one hour. A heating temperature of higher than 400° C. may result in a lower dissolution rate than when heated in the temperature range, and such a lowering of dissolution rate is presumed as attributable to formation of ceramic SiC.

EXAMPLE

Preparation Examples, Working Examples and Comparative Examples are given below for illustrating the present invention. The invention is not limited to the Examples.

Preparation Example 1

A 1-liter flask was charged with 152.5 g of ultrapure water, 297.5 g of ethanol and 14.9 g of a 25% tetramethylammonium hydroxide aqueous solution. In a nitrogen atmosphere and at 40° C., 157 g of 3,4-epoxycyclohexylethyltrimethoxysilane was added dropwise over 60 minutes. After 4 hours of ripening, 3.8 g of acetic acid was added to the reaction solution, from which ethanol and methanol were distilled off in a vacuum of 100 hPa. To the residue was added 475 g of ethyl acetate. The water layer was separated off, and the organic layer was washed with 120 g of ultrapure water, which procedure was repeated three times. To the organic layer was added 400 g of PGMEA. This solution was concentrated in a vacuum of 20 hPa, yielding 623 g of the solution. The nonvolatile content was 18.0 wt %. The silicone resin thus obtained had a weight average molecular weight of 3,600 as measured by GPC with polystyrene standards.

Preparation Example 2

A 500-ml flask was charged with 50 g of ultrapure water, 100 g of ethanol and 16.0 g of a 25% tetramethylammonium hydroxide aqueous solution. In a nitrogen atmosphere and at 40° C., a mixture of 7.4 g of 3,4-epoxycyclohexylethyltrimethoxysilane, 6.7 g of acetoxypropyltrimethoxysilane and 22.6 g of (2-methoxy-propoxy)propyltrimethoxysilane was added dropwise over 25 minutes. After 4 hours of ripening, 1.65 g of acetic acid was added to the reaction solution for neutralization, from which ethanol and methanol were distilled off in a vacuum of 100 hPa. To the residue was added 200 g of ethyl acetate. The water layer was separated off, and the organic layer was washed with 100 g of ultrapure water, which procedure was repeated three times. To the organic layer was added 180 g of PGMEA. This solution was concentrated in a vacuum of 20 hPa, yielding 170 g of the solution. The nonvolatile content was 13.6 wt %. The silicone resin thus obtained had a weight average molecular weight of 1,600 as measured by GPC with polystyrene standards.

Preparation Example 3

A 500-ml flask was charged with 50 g of ultrapure water, 100 g of ethanol and 5.0 g of a 25% tetramethylammonium hydroxide aqueous solution. In a nitrogen atmosphere and at 40° C., a mixture of 13.3 g of 3,3,3-trifluoropropyltrimethoxysilane, 11.1 g of glycidoxypropyltrimethoxysilane and 11.3 g of (2-methoxy-propoxy)propyltrimethoxysilane was added dropwise over 25 minutes. After 4 hours of ripening, 1.65 g of acetic acid was added to the reaction solution for neutralization, from which ethanol and methanol were distilled off in a vacuum of 100 hPa. To the residue was added 200 g of ethyl acetate. The water layer was separated off, and the organic layer was washed with 100 g of ultrapure water, which procedure was repeated three times. To the organic layer was added 200 g of PGMEA. This solution was concentrated in a vacuum of 20 hPa, yielding 160 g of the solution. The nonvolatile content was 14.8 wt %. The silicone resin thus obtained had a weight average molecular weight of 1,600 as measured by GPC with polystyrene standards.

Preparation Example 4

A 50-g portion of the PGMEA solution obtained in Preparation Example 3 was placed in a 1-liter flask, to which 0.50 g of benzoic acid was added. Reaction was effected at 100° C. for 24 hours. At the end of reaction, the solvent was completely distilled off in a vacuum of 20 hPa, 500 g of ethyl acetate was added to the residue for dissolution, and 200 g of ultrapure water was added for washing, which procedure was repeated five times. To the organic layer was added 100 g of PGMEA. This solution was concentrated in a vacuum of 20 hPa, yielding 70 g of the solution. The nonvolatile content was 10 wt %. The silicone resin thus obtained had a weight average molecular weight of 1,600 as measured by GPC with polystyrene standards.

Preparation Example 5

A 5-liter flask was charged with 915 g of ultrapure water, 1,884 g of ethanol and 300 g of a 25% tetramethylammonium hydroxide aqueous solution. In a nitrogen atmosphere and at 40° C., a mixture of 434 g of methyltrimethoxysilane and 662 g of tetraethoxysilane was added dropwise over 10 minutes. After 1 hour of ripening, 50 g of acetic acid was added and 1,800 g of PGMEA then added to the reaction solution, from which ethanol and methanol were distilled off in a vacuum of 100 hPa. To the residue was added 1,200 g of ethyl acetate. The water layer was separated off, and the organic layer was washed with 1,200 g of ultrapure water, which procedure was repeated three times. To the organic layer was added 2,400 g of propylene glycol monopropyl ether. This solution was concentrated in a vacuum of 20 hPa, yielding 2,400 g of the solution. The nonvolatile content was 16.4 wt %.

Examples 1-5 & Comparative Examples 1-2

A coating composition was prepared by adding a crosslinker, acid generator, surfactant and porogen to each of the resin compositions prepared in Preparation Examples 1 to 4, according to the recipe shown in Table 1, and diluting with PGMEA. The coating composition was applied onto a substrate and baked at 200° C. for 90 seconds.

For comparison purposes, Duo 248 was applied to a substrate and baked at 130° C. for 60 seconds and then at 200° C. for 60 seconds. Similarly, THMR-iP3300 was applied to a substrate and baked at 100° C. for 90 seconds and then at 200° C. for 90 seconds.

TABLE 1

| | Resin composition | Blending ratio (nonvolatile) | Crosslinker HMN | Acid generator BBI-109 | Surfactant FC-430 | Porogen (pbw) |
|---|---|---|---|---|---|---|
| Example 1 | Preparation Example 1 | 100 | 10 | 1 | 1 | PE-61 (30) |
| Example 2 | Preparation Example 2 | 100 | — | 1 | 1 | PE-61 (30) |
| Example 3 | Preparation Example 2 | 100 | 10 | 1 | 1 | PE-61 (30) |
| Example 4 | Preparation Example 2 | 100 | 10 | 1 | 1 | PEG-600 (30) |
| Example 5 | Preparation Example 2 | 100 | 10 | 1 | 1 | UP-1020 (30) |
| Example 6 | Preparation Example 3 | 100 | — | 1 | 1 | — |
| Example 7 | Preparation Example 4 | 100 | 10 | 1 | 1 | PE-61 (40) |
| Comparative Example 1 | Preparation Example 1 | 100 | — | 1 | 1 | — |
| Comparative Example 2 | Preparation Example 2 | 100 | 10 | 1 | 1 | — |
| Comparative Example 3 | Duo248 | 100 | — | — | — | — |
| Comparative Example 4 | THMR-iP3300 | 100 | — | — | — | — |

FC-430: surfactant by 3M
BBI-109: tert-butylphenyliodonium nonaflate by Midori Kagaku Co., Ltd.
HMM: crosslinker of the formula:

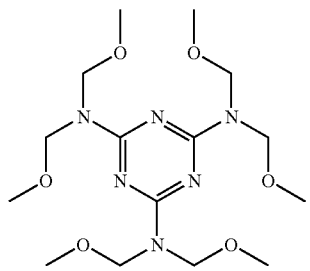

UP-1020: acrylic polymer by Toa Synthesis Co., Ltd.
PEG-600: polyethylene glycol (average molecular weight 600) by Wako Junyaku Co., Ltd.
Newpol PE-61: polyethylene oxide by Sanyo Chemical Industries, Ltd.
Duo248: anti-reflective film material for resist, by Honeywell International Inc.
THMR-iP3300: sacrificial film material by Tokyo Ohka Kogyo Co., Ltd.

[Preparation of Photoresist Film Material]

A polymer (designated Polymer A) shown below was furnished as a base resin for ArF photoresist film material.

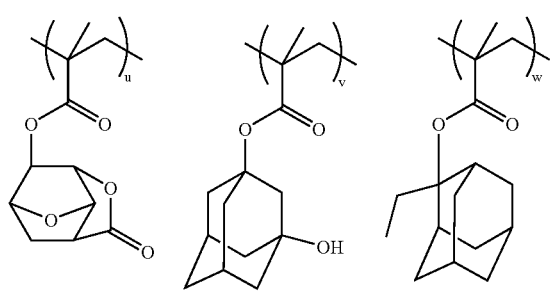

(ArF monolayer resist Polymer A)
(u=0.40, v=0.30, w=0.30 Mw7,800)

A polymer (designated Polymer B) shown below was furnished as a base resin for KrF photoresist film material.

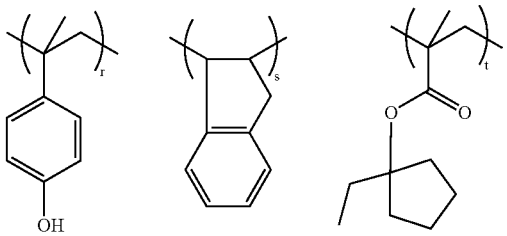

(KrF monolayer resist Polymer B)
(r=0.70, s=0.10, t=0.20 Mw9,300)

Using the polymers (Polymers A and B) furnished as above, photoresist film materials (Resist Nos. 1 and 2) for ArF and KrF lithography were prepared according to the formulation shown in Table 2.

The ingredients in Table 2 are identified below. Acid generator: PAG1 of the structural formula below

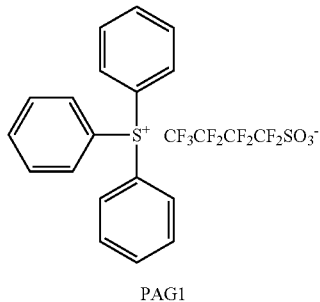

PAG1

Organic solvent: PGMEA (propylene glycol monomethyl ether acetate)

TABLE 2

| Resist No. | Polymer (pbw) | Acid generator (pbw) | Solvent (pbw) |
|---|---|---|---|
| 1 | Polymer A (100) | PAG1 (4.0) | PGMEA (1200) |
| 2 | Polymer B (100) | PAG1 (2.2) | PGMEA (1200) |

[Pattern Shape Observation, Etching Resistance Test, Stripping Solution Dissolution Test]

Pattern Shape Observation

The sacrificial film-forming material having anti-reflective function prepared above (Example 7 in Table 1) was applied onto a silicon substrate and baked at 200° C. for 120 seconds to form an anti-reflective film of 193 nm thick. The ArF resist solution of Polymer A was applied thereon and baked at 130° C. for 60 seconds to form a photoresist layer of 193 nm thick. The resist film was exposed on an ArF exposure device (S305B by Nikon Corp., NA 0.68, σ 0.85, 2/3 annular illumination, Cr mask), then baked (PEB) at 110° C. for 60 seconds and developed for 60 seconds with a 2.38 wt % aqueous solution of tetramethylammonium hydroxide (TMAH), obtaining a positive pattern. The shape of the resulting 0.12-micron line-and-space pattern was examined. The results are shown in Table 3.

In another run, the anti-reflective film-forming material prepared above (Comparative Example 5 in Table 1) was applied onto a silicon substrate and baked at 200° C. for 120 seconds to form an anti-reflective film of 200 nm thick. The KrF resist solution of Polymer B was applied thereon and baked at 120° C. for 60 seconds to form a photoresist layer of 200 nm thick. The resist film was exposed on a KrF exposure device (S203B by Nikon Corp., NA 0.68, σ 0.75, 2/3 annular illumination, Cr mask), then baked (PEB) at 120° C. for 60 seconds and developed for 60 seconds with a 2.38 wt % TMAH aqueous solution, obtaining a positive pattern. The shape of the resulting 0.15-micron line-and-space pattern was examined. The results are shown in Table 3.

TABLE 3

| Sacrificial film material (Table 1) | Photoresist film material (Table 2) | L/S resist pattern shape |
|---|---|---|
| Example 5 | 1 | perpendicular, no footing |
| Comparative Example 3 | 2 | footing |

It was found for both the films that no standing waves by reflection were detected and no intermixing occurred. However, footing was found in Comparative Example 3.

Etching Resistance Test

Anti-reflective films and sacrificial films formed from the anti-reflective film materials (Examples 1 to 7 and Comparative Examples 1 to 4), photoresist films formed from the photoresist film materials (Resist Nos. 1 and 2), and a low-dielectric constant film (dielectric constant 2.6) formed from Preparation Example 5 were examined for etching resistance by the following test. The results are shown in Table 4.

Etching test with $CHF_3/CF_4$ gas

Using a dry etching instrument TE-8500P by Tokyo Electron Co., Ltd., the anti-reflective films, resist films and $SO_2$ film were etched. A difference in thickness of the film before and after the etching test was determined.

Etching Conditions

| | |
|---|---|
| Chamber pressure: | 40.0 Pa |
| RF power: | 1300 W |
| Gap: | 9 mm |
| $CHF_3$ gas flow rate: | 30 ml/min |
| $CF_4$ gas flow rate: | 30 ml/min |
| Ar gas flow rate: | 100 ml/min |
| Time: | 10 sec |

TABLE 4

| Film material (Table 1) | $CHF_3/CF_4$ gas etching rate (nm/min) |
|---|---|
| Example 1 | 240 |
| Example 2 | 290 |
| Example 3 | 320 |
| Example 4 | 290 |
| Example 5 | 270 |
| Example 6 | 320 |
| Example 7 | 285 |
| Comparative Example 1 | 147 |
| Comparative Example 2 | 176 |
| Comparative Example 3 (Duo248) | 220 |
| Comparative Example 4 (THMR-iP3300) | 230 |
| Photoresist 1 | 146 |
| Photoresist 2 | 120 |
| Low-dielectric constant insulating film (Preparation Example 5) | 340 |

As seen from Table 4, the sacrificial films formed from the sacrificial film-forming materials within the scope of the invention (Examples 1 to 7) exhibit a higher rate of dry etching with $CHF_3/CF_4$ gas than the photoresist films. By adding or incorporating porogen or thermally labile groups, their etching rate is approximated to that of low-dielectric constant insulating film.

Stripping Solution Dissolution Test

Anti-reflective films, sacrificial films and low-dielectric constant film formed from the film materials (Examples 1 to 7, Comparative Examples 1 to 4, Preparation Example 5) were examined by a dissolution test in a stripping solution. The results are shown in Table 5.

The test included two stages.

1st stage: heat treatment prior to immersion

Condition A: no heat treatment

Condition B: heated in air at 350° C. for 90 seconds

2nd stage: immersion in stripper

Two strippers were used. The film was immersed in EKC-2255 (EKC Technology, basic stripping solution) at 50° C. for 10 minutes, or in DHF (0.5% dilute hydrofluoric acid solution) at 25° C. for 3 minutes.

TABLE 5

| Film material | Treatment | | | |
|---|---|---|---|---|
| | A | B | A | B |
| | Stripper | | | |
| | 0.5% DHF | EKC-2255 | | |
| | Film thickness reducing rate (nm/min) | | | |
| Example 1 | 5 | 97 | 12 | 25 |
| Example 2 | 18 | 96 | 8 | 35 |
| Example 3 | 35 | 98 | 10 | 41 |
| Example 4 | 40 | 98 | 15 | 45 |
| Example 5 | 29 | 95 | 6 | 26 |
| Example 6 | 34 | 98 | 12 | 38 |
| Example 7 | 5 | 96 | 4 | 20 |
| Comparative Example 1 | 1 | 26 | 0 | 0 |
| Comparative Example 2 | 5 | 81 | 1 | 15 |
| Comparative Example 3 (Duo248) | 96 | 97 | 5 | 0 |
| Comparative Example 4 (THMR-iP3300) | 96 | 98 | 0 | 0 |
| Low-dielectric constant insulating film (Preparation Example 5) | 2 | 2 | 0 | 0 |

It is seen from Table 5 that the sacrificial film-forming materials within the scope of the invention (Examples 1 to 7) are more readily strippable than the low-dielectric constant insulating film. Heat treatment achieves a significant increase of dissolution rate over Comparative Examples 1 and 2 which are porogen-free materials of the organic group-cure type, indicating an improvement in removal behavior. Comparative Examples 3 and 4 resulting from condensation cure of siloxane are almost composed of $SiO_2$, and they are readily dissolved in DHF (hydrofluoric acid), which can damage the low-dielectric constant insulating film, but not dissolved in a basic stripper which does not damage the low-dielectric constant insulating film. In contrast, the sacrificial films of Examples are more readily strippable than the inorganic crosslinking type anti-reflective films of Comparative Examples 1 and 2, and their strippability is further improved by heat treatment.

Japanese Patent Application No. 2004-172293 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A sacrificial film-forming composition comprising
(A) 100 parts by weight of an organofunctional silicone resin which is a co-hydrolytic condensate of a hydrolyzable silane having the general formula (1) and a hydrolyzable silane having the general formula (3), or a hydrolyzable silane having the general formula (1) and hydrolyzable silanes having the general formulas (2) and (3), $$X-Y-SiZ_3 \quad (1)$$

wherein Z is a hydrolyzable group; X is a crosslinkable organofunctional group selected from the group consisting of a hydroxyl group which may be substituted with an acid or thermally labile functional group, a substituted or unsubstituted epoxy group, a substituted or unsubstituted acyloxy group or a substituted or unsubstituted acryloxy group; and Y is single bond or a substituted or unsubstituted divalent (or trivalent when bonded to both two carbon atoms of an epoxy group) hydrocarbon group which may have an ether bond, ester bond or saturated cyclic structure in its structure, with the proviso that Y is not a single bond when X is a hydroxyl group, $$R_nSiZ_{4-n} \quad (2)$$

wherein Z is a hydrolyzable group and may be identical with or different from Z in formula (1), R is hydrogen or a substituted or unsubstituted monovalent hydrocarbon group which does not undergo a crosslinking reaction with other organic groups, and n is an integer of 0 to 3, $$P-SiZ_3 \quad (3)$$

wherein Z is a hydrolyzable group and may be identical with or different from Z in formulae (1) and (2), and P—Si is a group selected from the group consisting of the following formulas:

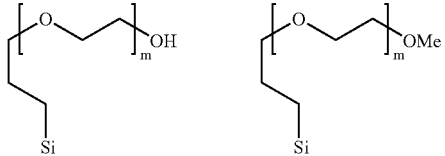

wherein Me is methyl and m is a number 1 to 200, said organofunctional silicone resin having a weight average molecular weight of at least 500,
(B) 1 to 20 parts by weight of a crosslinking agent which reacts with the crosslinkable organofunctional group in formula (1) in the presence of an acid catalyst to provide a curing ability component to (A),
(C) 0.001 to 5 parts by weight of an acid generator,
(D) 5 to 400 parts by weight of an extender or an organic resin component which readily decomposes and volatilizes upon heating, and
(E) 100 to 50,000 parts by weight of an organic solvent.

2. The composition of claim 1, wherein the crosslinkable organofunctional groups on the organofunctional silicone resin (A) provide cuing ability by inducing crosslinking reaction between identical or different silicone resins in the presence of an acid catalyst.

3. The composition of claim 1, wherein component (A) has a UV-absorbing structure incorporated therein.

4. A process of forming a pattern on a substrate by lithography, comprising the steps of:
applying the sacrificial film-forming composition of claim 3 onto a substrate having a low-dielectric constant material film formed thereon,
baking the composition to form a sacrificial film,
applying a photoresist material,
prebaking the material to form a photoresist film,
exposing the photoresist film to a pattern of light,
developing the photoresist film with a developer to form a resist pattern in the photoresist film,
etching the sacrificial film and the low-dielectric constant material film through the resist pattern serving as a mask, and
dissolving away the sacrificial film in a stripping solution, thereby forming a pattern on the substrate.

5. A process of forming a pattern on a substrate by lithography, comprising the steps of:
applying the sacrificial film-forming composition of claim 3 onto a substrate having a low-dielectric constant material film formed thereon,
baking the composition to form a sacrificial film,
applying a photoresist material,
prebaking the material to form a photoresist film,
exposing the photoresist film to a pattern of light,
developing the photoresist film with a developer to form a resist pattern in the photoresist film,
etching the sacrificial film and the low-dielectric constant material film through the resist pattern serving as a mask,
effecting plasma treatment, and
dissolving away the sacrificial film in a stripping solution, thereby forming a pattern on the substrate.

6. A process of forming a pattern on a substrate by lithography, comprising the steps of:
applying the sacrificial film-forming composition of claim 3 onto a substrate having a low-dielectric constant material film formed thereon,
baking the composition to form a sacrificial film,
applying a photoresist material,
prebaking the material to form a photoresist film, exposing the photoresist film to a pattern of light,
developing the photoresist film with a developer to form a resist pattern in the photoresist film,
etching the sacrificial film and the low-dielectric constant material film through the resist pattern serving as a mask,
effecting heat treatment, and
dissolving away the sacrificial film in a stripping solution, thereby forming a pattern on the substrate.

7. A process of forming a pattern on a substrate by lithography, comprising the steps of:
applying the sacrificial film-forming composition of claim 1 onto a substrate having a low-dielectric constant material film formed thereon,
baking the composition to form a sacrificial film,
forming an antireflective film on the sacrificial film when a UV-absorbing structure is not incorporated in component (A),
applying a photoresist material,
prebaking the material to form a photoresist film,
exposing the photoresist film to a pattern of light,
developing the photoresist film with a developer to form a resist pattern in the photoresist film,
etching the antireflective film, the sacrificial film and the low-dielectric constant material film through the resist pattern serving as a mask, and
dissolving away the sacrificial film in a stripping solution, thereby forming a pattern on the substrate.

8. A process of forming a pattern on a substrate by lithography, comprising the steps of:
applying the sacrificial film-forming composition of claim 1 onto a substrate having a low-dielectric constant material film formed thereon,
baking the composition to form a sacrificial film,
forming an antireflective film on the sacrificial film when a UV-absorbing structure is not incorporated in component (A)
applying a photoresist material,
prebaking the material to form a photoresist film,
exposing the photoresist film to a pattern of light,
developing the photoresist film with a developer to form a resist pattern in the photoresist film,
etching the antireflective film, the sacrificial film and the low-dielectric constant material film trough the resist pattern serving as a mask,
effecting plasma treatment, and
dissolving away the sacrificial film in a stripping solution, thereby forming a pattern on the substrate.

9. The composition of claim 1, wherein X—Y—Si in formula (1) is a group selected from the group consisting of the following formulas:

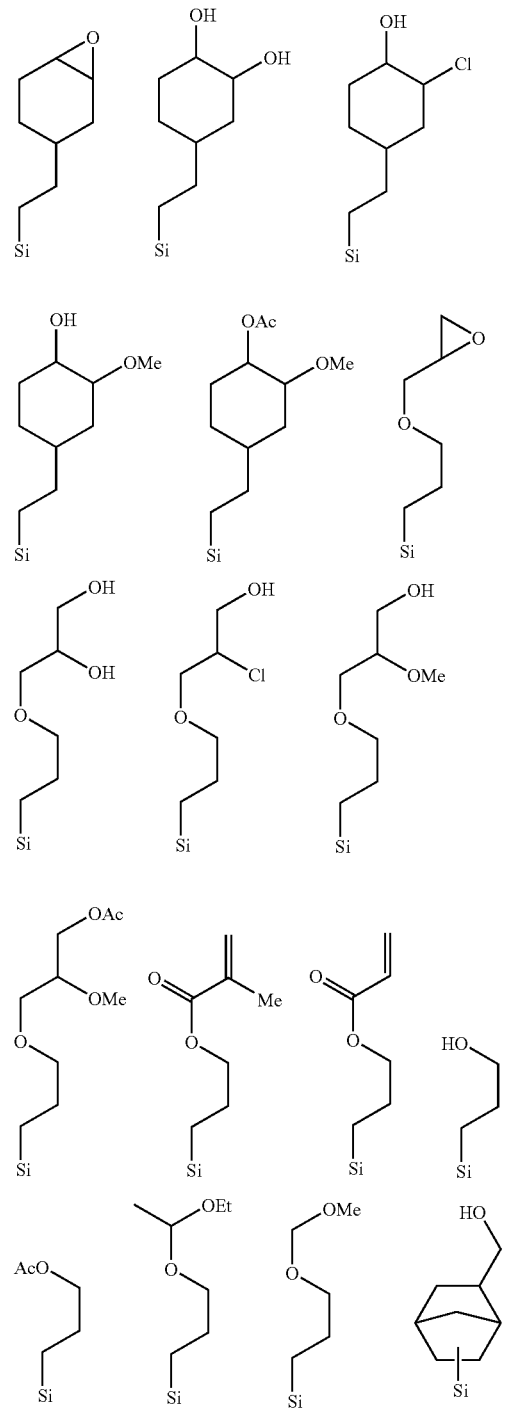

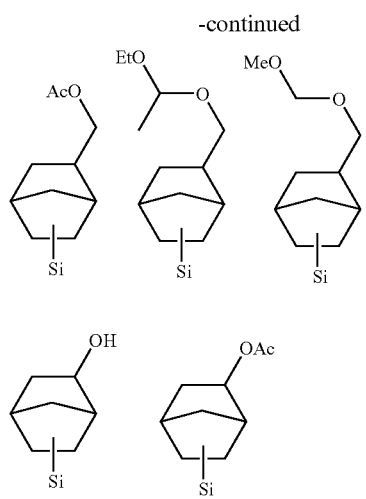
wherein Me is methyl, Et is ethyl, and Ac is acetyl.
10. The composition of claim 1, wherein X—Y—SiZ₃ of formula (1) is a compound selected from the group consisting of the following formulas:
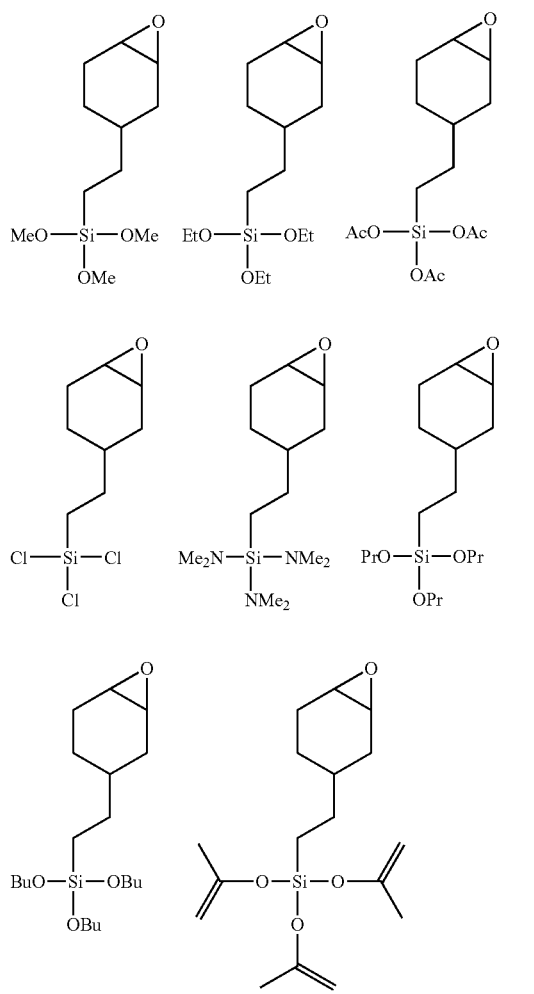
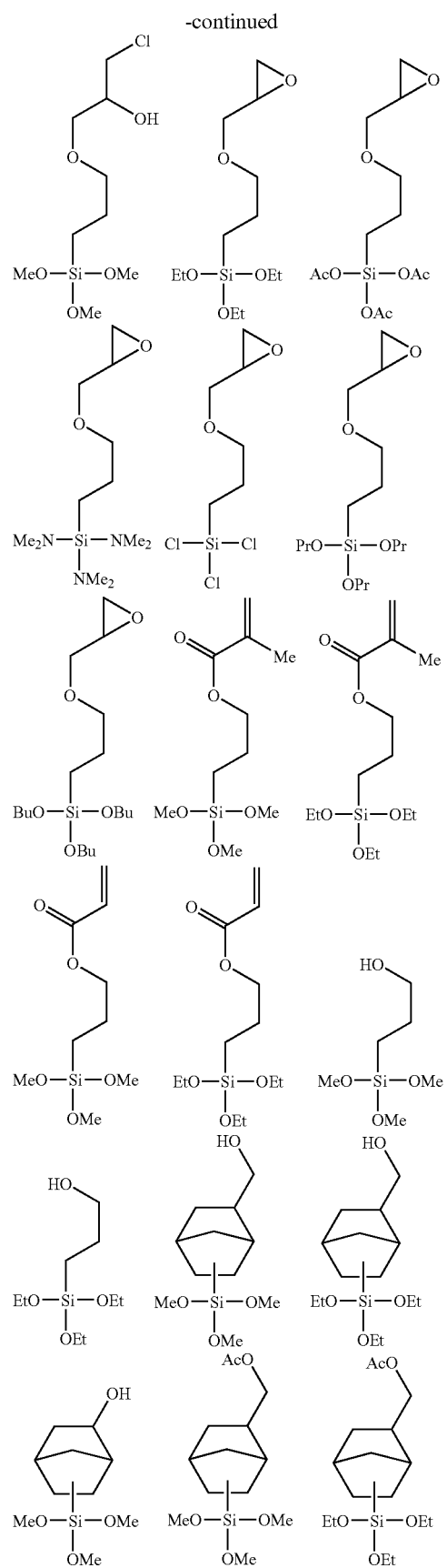

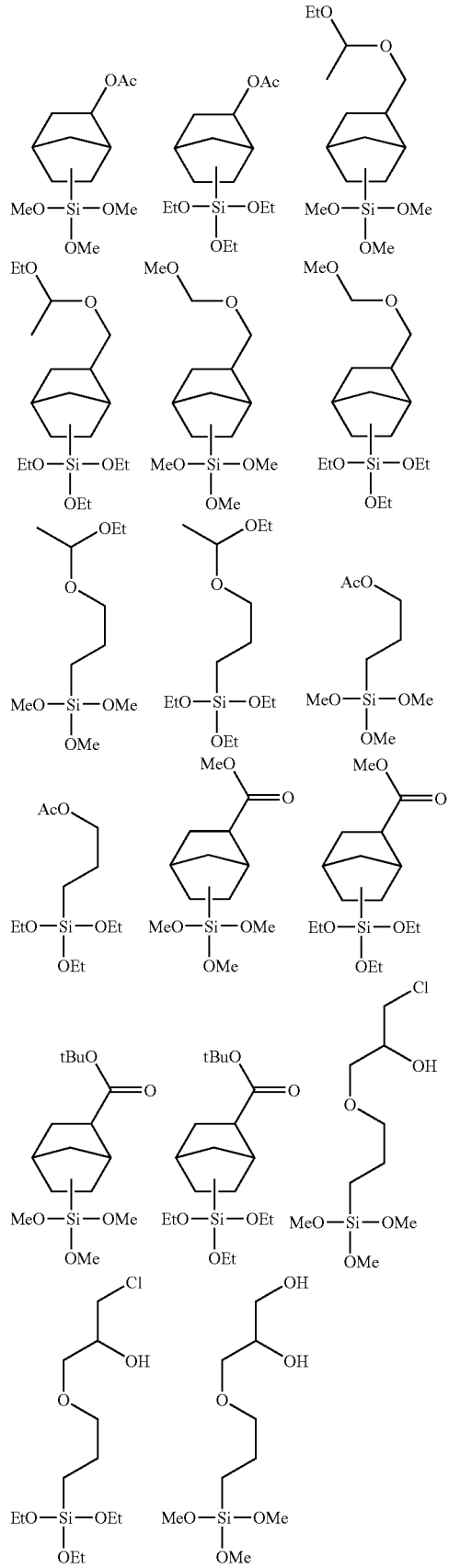
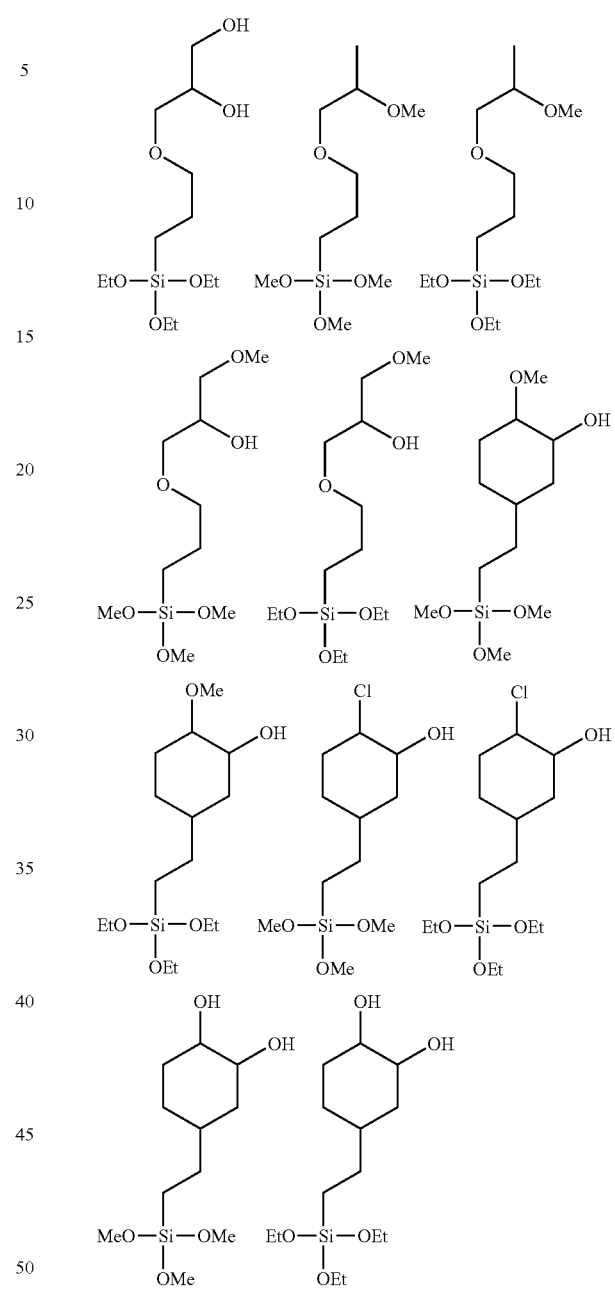

wherein Me is methyl, Et is ethyl, Pr is propyl, Ru is butyl, tBu is tert-butyl, and Ac is acetyl.

11. The composition according to claim 1, wherein said composition forms a sacrificial film-forming composition.

12. The composition according to claim 1, wherein (D) is selected from the group consisting of polyvinyl alcohols, polyacetals, polycarbohydrates, polyethers, (meth)acrylic resins, polyalkylene glycols, and vinylamide resins.

13. The composition according to claim 12, wherein (D) is selected from the group consisting of polyethylene glycol, polypropylene glycol, polymethyl (meth)acrylate, polyethyl (meth)acrylate, poly(meth)acrylic acid, poly(N-vinylacetamide) and poly(N-vinylpyrrolidone).

14. A sacrificial film which is obtained by a process comprising:

applying a sacrificial film-forming composition comprising:

(A) 100 parts by weight of an organofunctional silicone resin which is a co-hydrolytic condensate of a hydrolyzable silane having the general formula (1) and a hydrolyzable silane having the general formula (3), or a hydrolyzable silane having the general formula (1) and hydrolyzable silanes having the general formulas (2) and (3), $$X-Y-SiZ_3 \tag{1}$$

wherein Z is a hydrolyzable group; X is a crosslinkable or organofunctional group selected from the group consisting of a hydroxyl group which may be substituted with an acid or thermally labile functional group, a substituted or unsubstituted epoxy group, a substituted or unsubstituted acyloxy group or a substituted or unsubstituted acryloxy group; and Y is single bond or a substituted or unsubstituted divalent (or trivalent when bonded to both two carbon atoms of an epoxy group) hydrocarbon group which may have an ether bond, ester bond or saturated cyclic structure in its structure, with the proviso that Y is not a single bond when X is a hydroxyl group, $$R_nSiZ_{4-n} \tag{2}$$

wherein Z is a hydrolyzable group and may be identical with or different from Z in formula (1), R is hydrogen or a substituted or unsubstituted monovalent hydrocarbon group which does not undergo a crosslinking reaction with other organic groups, and n is an integer of 0 to 3, $$P-SiZ_3 \tag{3}$$

wherein Z is a hydrolyzable group and may be identical with or different from Z in formulae (1) and (2), and P—Si is a group selected from the group consisting of the following formulas:

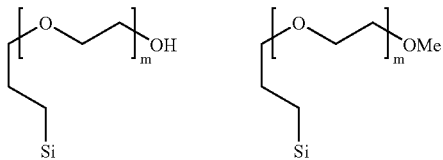

wherein Me is methyl and m is a number 1 to 200, said organofunctional silicone resin having a weight average molecular weight of at least 500.

(B) 1 to 20 parts by weight of a crosslinking agent which reacts with the crosslinkable organofunctional group in formula (1) in the presence of an acid catalyst to provide a curing ability component to (A), (C) 0.001 to 5 parts by weight of an acid generator, (D) 5 to 400 parts by weight of an extender or an organic resin component which readily decomposes and volatilizes upon heating, and (E) 100 to 50,000 parts by weight of an organic solvent onto a substrate; and baking the composition.

15. A method of removing a sacrificial film, comprising the step of treating the sacrificial film of claim 14 with an acidic or basic stripping solution for dissolving away the sacrificial film at a high selectivity relative to an underlying layer of low-dielectric constant material film.

* * * * *